US012002808B2

(12) United States Patent
Xie et al.

(10) Patent No.: US 12,002,808 B2
(45) Date of Patent: Jun. 4, 2024

(54) DUAL DIELECTRIC PILLAR FORK SHEET DEVICE

(71) Applicant: International Business Machines Corporation, Armonk, NY (US)

(72) Inventors: Ruilong Xie, Niskayuna, NY (US); Julien Frougier, Albany, NY (US); Kangguo Cheng, Schenectady, NY (US); Dimitri Houssameddine, Sunnyvale, CA (US)

(73) Assignee: International Business Machines Corporation, Armonk, NY (US)

( * ) Notice: Subject to any disclaimer, the term of this patent is extended or adjusted under 35 U.S.C. 154(b) by 383 days.

(21) Appl. No.: 17/397,242

(22) Filed: Aug. 9, 2021

(65) Prior Publication Data

US 2023/0038116 A1    Feb. 9, 2023

(51) Int. Cl.
*H01L 27/092*    (2006.01)
*H01L 21/02*    (2006.01)
(Continued)

(52) U.S. Cl.
CPC ........ *H01L 27/092* (2013.01); *H01L 21/0259* (2013.01); *H01L 21/823807* (2013.01);
(Continued)

(58) Field of Classification Search
CPC ............... H01L 27/092; H01L 21/0259; H01L 21/823807; H01L 21/823878; H01L 29/0665; H01L 29/42392; H01L 29/66545; H01L 29/66553; H01L 29/66742; H01L 29/78696
See application file for complete search history.

(56) References Cited

U.S. PATENT DOCUMENTS 7,049,652 B2    5/2006    Mokhlesi
9,614,056 B2    4/2017    Xie
(Continued)

FOREIGN PATENT DOCUMENTS

EP    3567003 A1    11/2019

OTHER PUBLICATIONS

Singh et al., "Vertically Stacked SiGe Nanowire Array Channel CMOS Transistors", IEEE Electron Device Letters • Apr. 2007.
(Continued)

*Primary Examiner* — Lex H Malsawma
*Assistant Examiner* — Sean Ayers Winters
(74) *Attorney, Agent, or Firm* — Matthew Zehrer

(57) ABSTRACT

A forksheet transistor device includes a dual dielectric pillar that includes a first dielectric and a second dielectric that is different from the first dielectric. The dual dielectric pillar physically separates pFET elements from nFET elements. For example, the first dielectric physically separates a pFET gate from a nFET gate while the second dielectric physically separates a pFET source/drain region from a nFET source drain region. When it is advantageous to electrically connect the pFET gate and the nFET gate, the first dielectric may be etched selective to the second dielectric to form a gate connector trench within the dual dielectric pillar. Subsequently, an electrically conductive gate connector strap may be formed within the gate connector trench to electrically connect the pFET gate and the nFET gate.

20 Claims, 19 Drawing Sheets

FIG. 13A

(51) Int. Cl.
*H01L 21/8238* (2006.01)
*H01L 29/06* (2006.01)
*H01L 29/423* (2006.01)
*H01L 29/66* (2006.01)
*H01L 29/786* (2006.01)

(52) U.S. Cl.
CPC .. *H01L 21/823878* (2013.01); *H01L 29/0665* (2013.01); *H01L 29/42392* (2013.01); *H01L 29/66545* (2013.01); *H01L 29/66553* (2013.01); *H01L 29/66742* (2013.01); *H01L 29/78696* (2013.01)

(56) References Cited

U.S. PATENT DOCUMENTS

| | | | |
|---|---|---|---|
| 9,634,091 B2 | 4/2017 | Ching | |
| 9,984,936 B1 | 5/2018 | Xie | |
| 10,332,963 B1* | 6/2019 | Xie | H01L 29/66636 |
| 10,510,620 B1* | 12/2019 | Chanemougame | H01L 27/0924 |
| 10,707,303 B1 | 7/2020 | Wang | |
| 10,957,793 B2 | 3/2021 | Paraschiv | |
| 2020/0035567 A1* | 1/2020 | Chanemougame | H01L 29/401 |

OTHER PUBLICATIONS

P. Weckx et al., "Novel forksheet device architecture as ultimate logic scaling device towards 2nm," 2019 IEEE International Electron Devices Meeting (IEDM), 2019, pp. 36.5.1-36.5.4, doi: 10.1109/IEDM19573.2019.8993635.

* cited by examiner

DUAL DIELECTRIC PILLAR FORK SHEET DEVICE

BACKGROUND

Various embodiments of the present application generally relate semiconductor device fabrication methods and resulting structures. More specifically the various embodiments relate to a forksheet transistor that includes a dual dielectric pillar between its nFET and pFET.

SUMMARY

In an embodiment of the present invention, a forksheet nanosheet semiconductor device is presented. The forksheet nanosheet semiconductor device includes a first nanosheet stack, a second nanosheet stack, and a dual dielectric pillar. The first nanosheet stack includes a plurality of first channel nanosheets each connected to a first source and connected to a first drain. The first nanosheet stack further includes a first gate surrounding the plurality of first channel nanosheets. The second nanosheet stack includes a plurality of second channel nanosheets each connected to a second source and connected to a second drain. The second nanosheet stack further includes a second gate surrounding the plurality of second channel nanosheets. The dual dielectric pillar includes a first dielectric and a second dielectric. The dual dielectric pillar is located between the plurality of first channel nanosheets and the plurality of second channel nanosheets, between the first source and the second source, between the first drain and the second drain, and between the first gate and the second gate.

In an embodiment of the present invention, a forksheet nanosheet semiconductor device fabrication method is presented. The method includes forming a plurality of channel nanosheets upon a substrate. The method includes forming a dielectric pillar that includes a first dielectric within the nanosheet stack, thereby forming a first plurality of channel nanosheets physically separated from a second plurality of channel nanosheets by the dielectric pillar. The method further includes forming a pair of in-line gate structures upon the substrate, surrounding the first plurality of channel nanosheets, and surrounding the second plurality of channel nanosheets. The method further includes forming a trench within the dielectric pillar self-aligned to the pair of in-line gate structures. The method further includes forming a second dielectric different that the first dielectric within the trench to form a dual dielectric pilar.

In another embodiment of the present invention, a forksheet semiconductor device is presented. The forksheet semiconductor device includes a first side physically separated from a second side by a dual dielectric pillar that includes a first dielectric and a second dielectric that is different from the first dielectric. The forksheet semiconductor device further includes a first source/drain region within the first side that is at least partially physically separated by a second source/drain region within the second side by the second dielectric. The forksheet semiconductor device further includes an in-line gate structure comprising a first gate within the first side at least partially physically separated by a second gate within a second side by the first dielectric.

These and other embodiments, features, aspects, and advantages will become better understood with reference to the following description, appended claims, and accompanying drawings.

DETAILED DESCRIPTION

Figure 1:
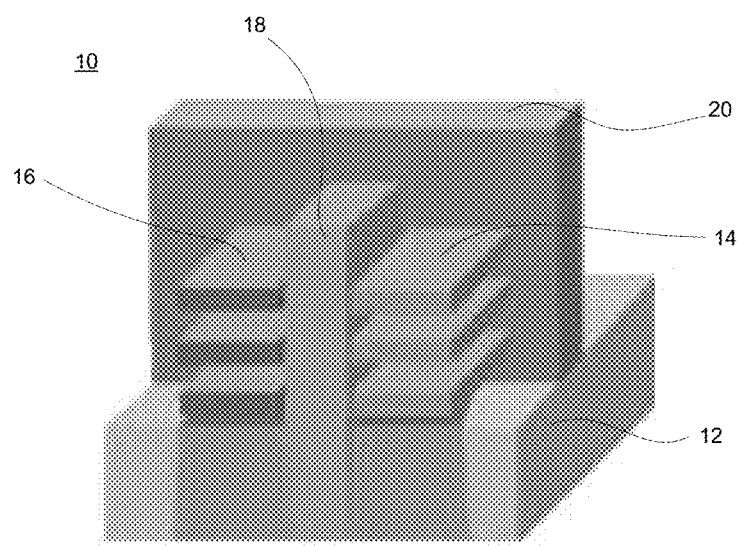
FIG. 1 depicts a perspective view of a prior art forksheet transistor.

It is understood in advance that although a detailed description is provided herein of an exemplary forksheet FET architecture having nFET silicon (Si) channel nanosheets and pFET silicon (Si) channel nanosheets separated by a dual dielectric pillar, implementation of the teachings recited herein are not limited to the particular FET architecture described herein. Rather, embodiments of the present invention are capable of being implemented in conjunction with any other appropriate type of FET device now known or later developed.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" upon layer "B" include situations in which one or more intermediate layers (e.g., layer "C") is between layer "A" and layer "B" as long as the relevant characteristics and functionalities of layer "A" and layer "B" are not substantially changed by the intermediate layer(s).

For purposes of the description hereinafter, the terms "upper," "lower," "right," "left," "vertical," "horizontal," "top," "bottom," and derivatives thereof relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact," or the like, means that a first element, such as a first structure, and a second element, such as a second structure, are connected without any intermediary conducting, insulating or semiconductor layers at the interface of the two elements. It should be noted that the term "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, substantial coplanarity between various materials can include an appropriate manufacturing tolerance of ±8%, ±5%, or ±2% difference between the coplanar materials.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to a more detailed description of technologies that are more specifically relevant to aspects of the present invention, transistors are semiconductor devices commonly found in a wide variety of ICs. A transistor is essentially a switch. When a voltage is applied to a gate of the transistor that is greater than a threshold voltage, the switch is turned on, and current flows through the transistor. When the voltage at the gate is less than the threshold voltage, the switch is off, and current does not flow through the transistor.

Semiconductor devices can be formed in the active regions of a wafer. The active regions are defined by isolation regions used to separate and electrically isolate adjacent semiconductor devices. For example, in an integrated circuit having a plurality of metal oxide semiconductor field effect transistors (MOSFETs), each MOSFET has a source and a drain that are formed in an active region of a semiconductor layer by implanting n-type or p-type impurities in the layer of semiconductor material. Disposed between the source and the drain is a channel (or body) region. Disposed above the body region is a gate. The gate and the body are spaced apart by a gate dielectric layer. The channel connects the source and the drain, and electrical current flows through the channel from the source to the drain. The electrical current flow is induced in the channel region by a voltage applied at the gate.

The wafer footprint of an FET is related to the electrical conductivity of the channel material. If the channel material has a relatively high conductivity, the FET can be made with a correspondingly smaller wafer footprint. A known method of increasing channel conductivity and decreasing FET size is to form the channel as a nanostructure. For example, a prior art forksheet FET 10 with substrate 12 is depicted in FIG. 1. Forksheet FET 10 may be fabricated by forming nFET channel nanosheets 14 and pFET channel nanosheets 16 between a single dielectric pillar 18. The nFET channel nanosheets 14 and pFET channel nanosheets 16 are controlled by a forked gate structure 20, realized by introducing the single dielectric pillar 18 in between the pMOS and nMOS devices before gate 20 patterning. This single dielectric pillar 18 physically isolates the pMOS side from the nMOS, allowing a much tighter n-to-p spacing.

One or more embodiments of the invention also provide fabrication methods and resulting forksheet FET structures that may include a dual dielectric pillar that physically isolates the pMOS side from the nMOS. The dual dielectric pillar may include a first dielectric in a gate region and a second dielectric in the source/drain regions. Discrete gates may be connected by patterning the dual dielectric pillar by etching the first dielectric selective to the second dielectric and forming the gate connector within the pattern of the dual dielectric pillar. Such fabrication methods and resulting semiconductor device structures, in accordance with embodiments of the invention, are described in detail below by referring to the accompanying drawings.

Figure 2:
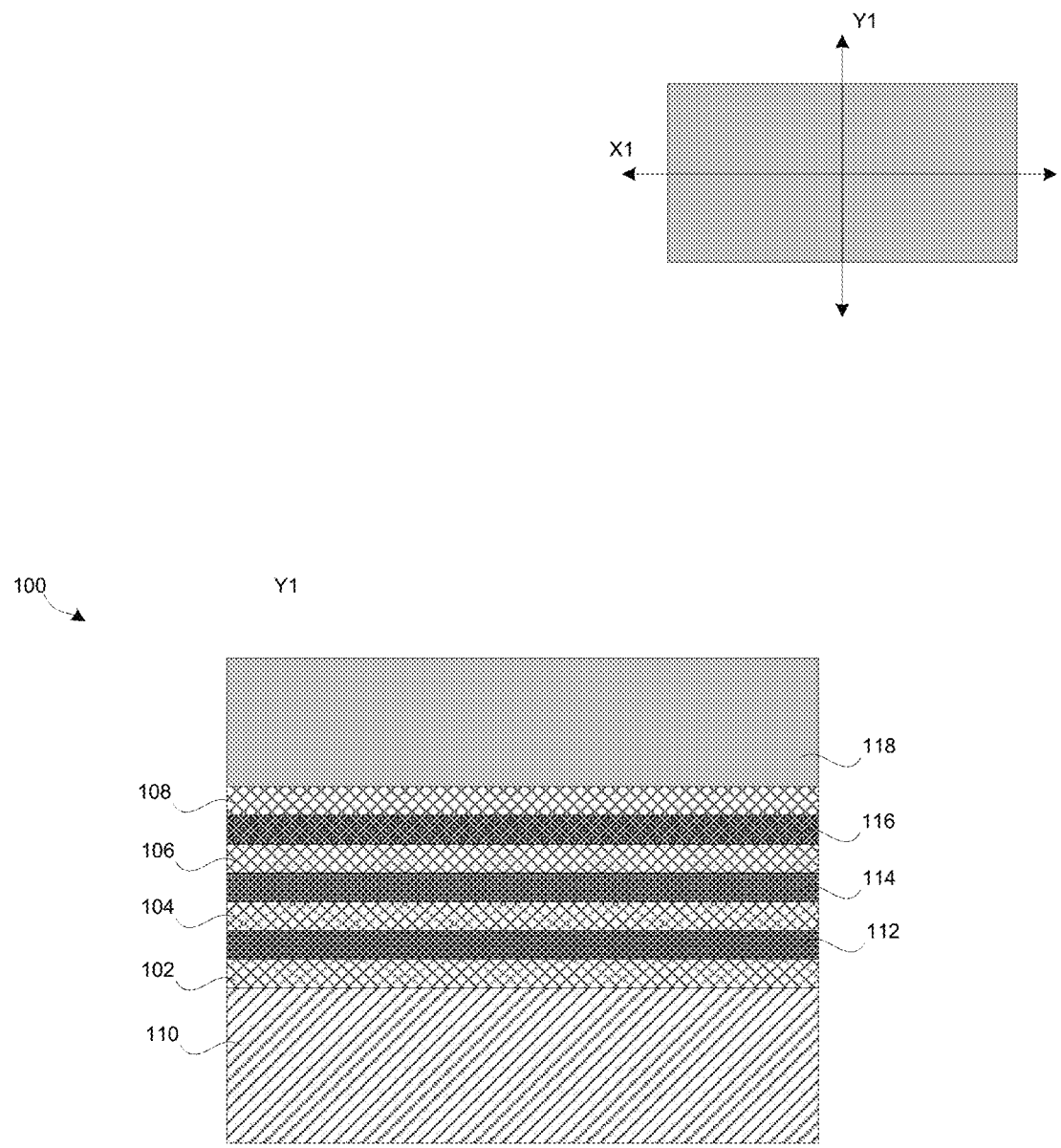
FIG. 2 depicts cross-sectional view of a semiconductor structure shown after a fabrication operation, taken along plane Y1, in accordance with one or more embodiments.

FIG. 2 depicts a cross-sectional view of a semiconductor structure 100 shown after initial fabrication operations, taken along plane Y1, in accordance with one or more embodiments. The initial fabrication operations may include forming a substrate 110, forming alternating layers of sacrificial nanosheets 102, 104, 106, 108 and channel nanosheets 112, 114, and 116, configured and arranged as shown, and forming a mask layer 118 upon the sacrificial nanosheet layer 108.

Plane Y1 is defined as a cross-sectional plane along the length of an inline forksheet gate, as depicted.

Non-limiting examples of suitable materials for the substrate 110 include Si (silicon), strained Si, SiC (silicon carbide), Ge (germanium), SiGe (silicon germanium), SiGe:C (silicon-germanium-carbon), Si alloys, Ge alloys, III-V materials (e.g., GaAs (gallium arsenide), InAs (indium arsenide), InP (indium phosphide), or aluminum arsenide (AlAs)), II-VI materials (e.g., CdSe (cadmium selenide), CdS (cadmium sulfide), CdTe (cadmium telluride), ZnO (zinc oxide), ZnSe (zinc selenide), ZnS (zinc sulfide), or ZnTe (zinc telluride)), or any combination thereof. Other non-limiting examples of semiconductor materials include III-V materials, for example, indium phosphide (InP), gallium arsenide (GaAs), aluminum arsenide (AlAs), or any combination thereof. The III-V materials can include at least one "III element," such as aluminum (Al), boron (B), gallium (Ga), indium (In), and at least one "V element," such as nitrogen (N), phosphorous (P), arsenic (As), antimony (Sb). The substrate 110 can be a bulk semiconductor material that includes Si.

In some embodiments of the invention, the channel nanosheets 112, 114, and 116 are formed from silicon (Si), and the sacrificial nanosheets 102, 104, 106, 108 are formed from silicon germanium (SiGe). The channel nanosheets 112, 114, and 116 can include, for example, monocrystalline Si. The channel nanosheets 112, 114, and 116 can have a thickness of, for example, from about 4 to about 10 nm, from about 4 to about 7 nm, or of about 7 nm. In embodiments where the sacrificial nanosheets 102, 104, 106, 108 include SiGe, for example, SiGe having a Ge concentration of about 25 atomic percent. The sacrificial nanosheets 102, 104, 106 can have a thickness of, for example, about 12 nm. Mask layer 118 may be formed by depositing known hard mask material(s) upon sacrificial nanosheet 108.

In some embodiments, the alternating series of sacrificial nanosheets 102, 104, 106, 108, channel nanosheets 112, 114, and 116 are formed by epitaxially growing one layer and then the next until the desired number and desired thicknesses of such layers are achieved. Epitaxial materials can be grown from gaseous or liquid precursors. Epitaxial materials can be grown using vapor-phase epitaxy (VPE), molecular-beam epitaxy (MBE), liquid-phase epitaxy (LPE), or other suitable process. Epitaxial silicon, silicon germanium, and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments of the invention, epitaxial growth and/or deposition processes are selective to forming on semiconductor surfaces, and generally do not deposit material on exposed surfaces, such as silicon dioxide or silicon nitride surfaces.

In some embodiments of the invention, the gas source for the deposition of epitaxial semiconductor material include a silicon containing gas source, a germanium containing gas source, or a combination thereof. For example, an epitaxial silicon layer can be deposited from a silicon gas source that is selected from the group consisting of silane, disilane, trisilane, tetrasilane, hexachlorodisilane, tetrachlorosilane, dichlorosilane, trichlorosilane, methyl silane, dimethylsilane, ethyl silane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium, and argon can be used.

Figure 3:
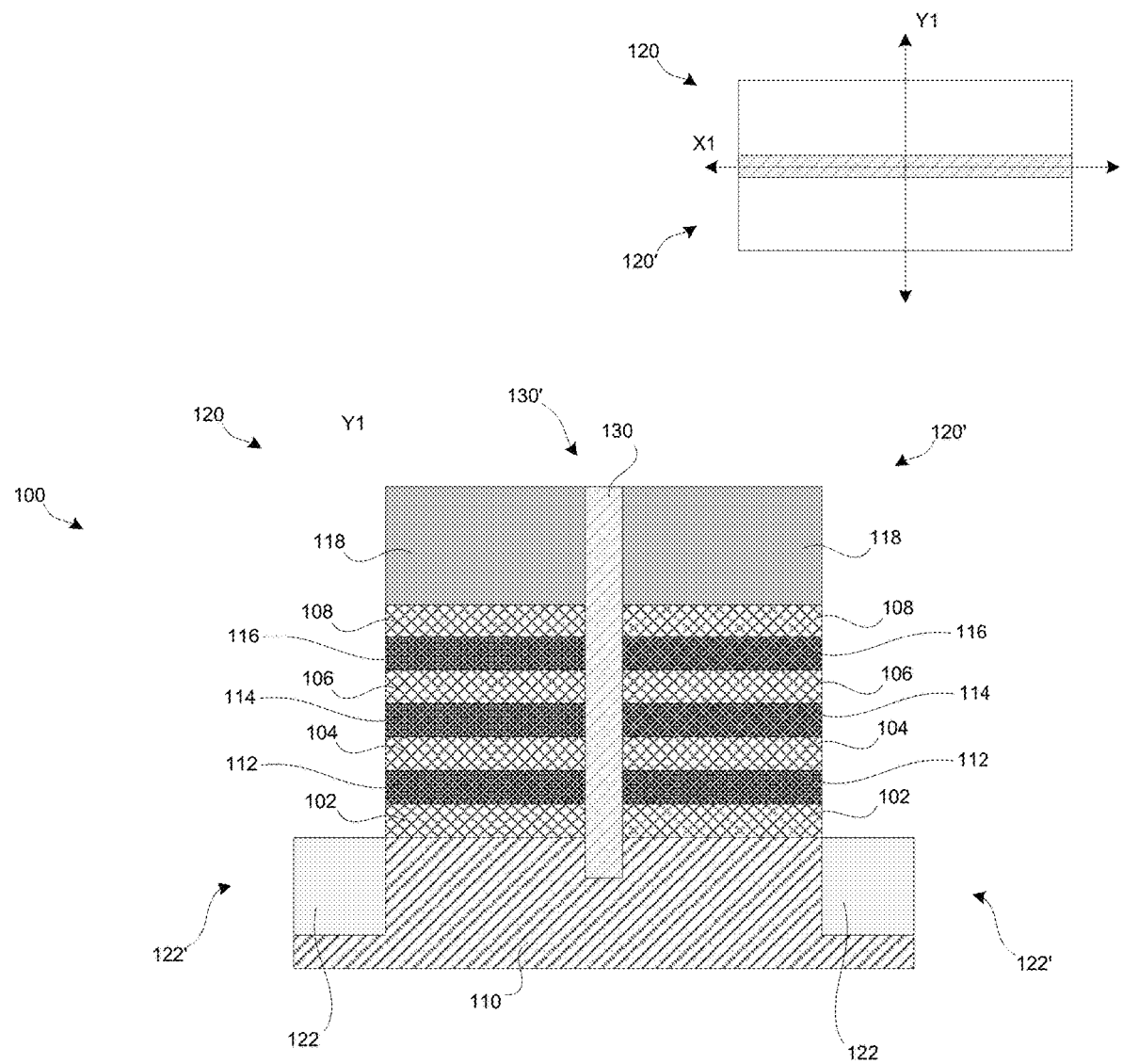
FIG. 3 depicts cross-sectional view of a semiconductor structure shown after a fabrication operation, taken along plane Y1, in accordance with one or more embodiments.

FIG. 3 depicts cross-sectional view of semiconductor structure 100 shown after fabrication operations, taken along plane Y1, in accordance with one or more embodiments. During the present fabrication stages, sacrificial nanosheets 102, 104, 106, 108 and channel nanosheets 112, 114, and 116 are patterned, shallow trench isolation (STI) regions 122 are formed, and a dielectric pillar 130 is formed.

Plane X1 is defined as a cross-sectional plane along the length of a forksheet pillar, as is depicted.

Sacrificial nanosheets 102, 104, 106, 108 and channel nanosheets 112, 114, and 116 may be patterned by removing respective undesired portions while retaining respective desired portions, as depicted. Similarly, mask layer 118 may be patterned by removing respective undesired portions while retaining respective desired portions, as depicted.

The removal of undesired portions of sacrificial nanosheets 102, 104, 106, 108, removal of undesired portions of the channel nanosheets 112, 114, and 116, and removal of undesired portions of the mask layer 118 can be accomplished using, for example, a sidewall image transfer (SIT) operation, a wet etch process, or a dry etch process. The removal of such undesired portions may further remove undesired portions of substrate 110 there below, as depicted. Such removal may form pillar trench 130' and STI trench 122', as depicted Desired portions of sacrificial nanosheets 102, 104, 106, 108, desired portions of the channel nanosheets 112, 114, and 116, and desired portions of the mask 118 may be retained and generally form respective nanosheet stacks within pMOS side 120 and withing nMOS side 120'.

Shallow trench isolation (STI) regions 122 may be formed by depositing STI material upon the substrate 110 within the STI trenches 122'. STI regions 122 may electrically isolate components or features of neighboring forksheet FETs, or the like, as is known in the art.

Dielectric pillar 130 may be formed by depositing a first dielectric material upon the substrate and between the respective nanosheet stacks within pMOS side 120 and withing nMOS side 120' within pillar trench 130'. For example, the dielectric pillar 130 can be formed by any suitable techniques such as deposition (ALD, CVD, etc.) followed by directional etch. As such, the dielectric pillar 130 physically and, at least partially, electrically separates the respective nanosheet stacks within pMOS side 120 and within nMOS side 120'. Dielectric pillar 130 can have a width of from about 5 nm to about 40 nm. In some embodiments, the dielectric pillar 130 can have a width of from about 10 nm to about 20 nm, although other widths are within the contemplated scope of the invention. Exemplary first dielectric materials may be, but are not limited to: silicon nitride (SiN), silicon carbide (SiC), silicon oxynitride (SiON), carbon-doped silicon oxide (SiOC), silicon-carbon-nitride (SiCN), boron nitride (BN), silicon boron nitride (SiBN), silicoboron carbonitride (SiBCN), silicon oxycarbonitride (SiOCN), silicon oxide, and combinations thereof. The dielectric pillar can be a low-k material having a dielectric constant less than about 7, less than about 5.

After deposition, excessive dielectric material can be removed by etching back or polish process. Removal of the mask 118 can be accomplished using, for example, a selective wet etch process, or a selective dry etch process, or other subtractive operation, as is known in the art.

Figure 4:
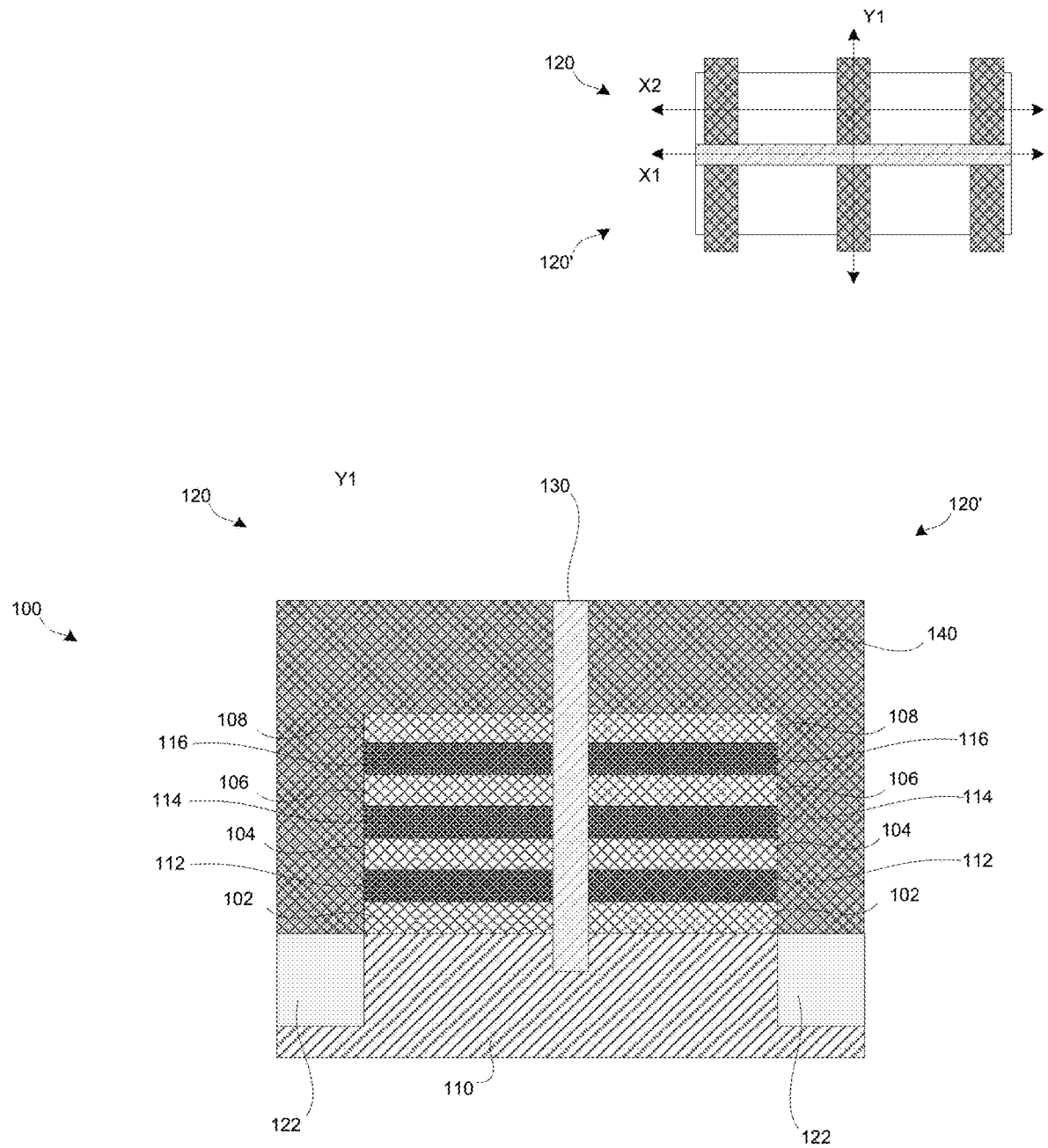
FIG. 4 depicts cross-sectional view of a semiconductor structure shown after a fabrication operation, taken along plane Y1, in accordance with one or more embodiments.

FIG. 4 depicts cross-sectional view of semiconductor structure 100 shown after a fabrication operation, taken along plane Y1, in accordance with one or more embodiments. During the present fabrication stage, the mask 118 may be removed, a sacrificial gate 140 may be formed, and a chemical mechanical polish (CMP) may planarize an upper surface of the sacrificial gate 140 and the dielectric pillar 130.

The sacrificial gate 140 may be formed by initially depositing a sacrificial gate liner (e.g. a dielectric, oxide, or the like) upon substrate 110, upon the STI region(s) 122, and upon the nanosheet stacks within both the nMOS side 120' and within the pMOS side 120. The gate dielectric may also be formed around exposed portions of the dielectric pillar 130. The sacrificial gate 140 may further be formed by subsequently depositing a sacrificial gate material (e.g. a dielectric, amorphous silicon, or the like) upon the sacrificial gate liner. The CMP may planarize the upper surface of the sacrificial gate 140 and the dielectric pillar 130, as is depicted.

Each gate structure 140 can initially be formed on targeted regions of bulk nanosheet material to define the length of an individual transistor structure, and to provide sacrificial material for yielding targeted transistor structure in subsequent processing.

Figure 5:
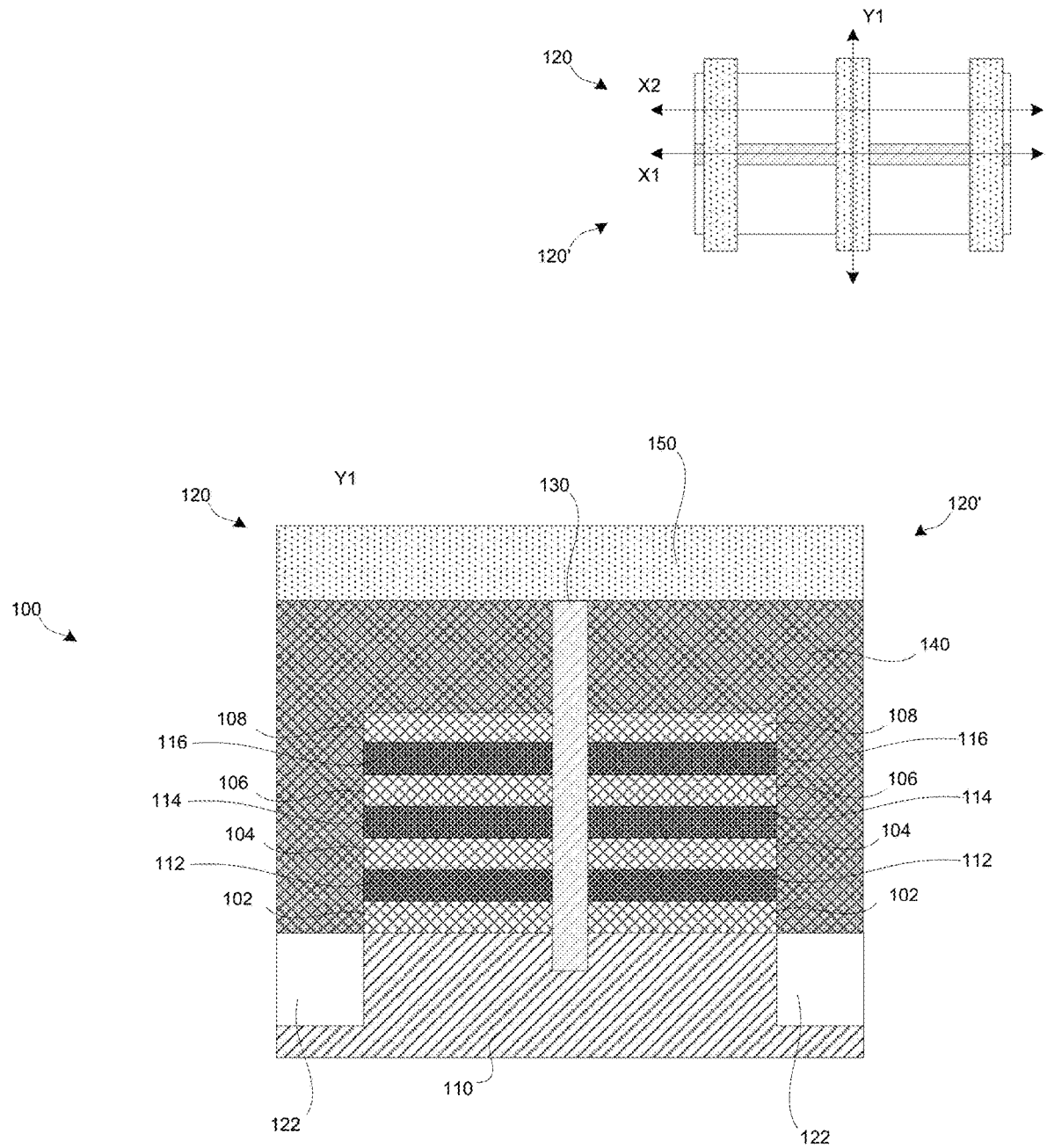
FIG. 5 depicts cross-sectional view of a semiconductor structure shown after a fabrication operation, taken along plane Y1, in accordance with one or more embodiments.
Figure 5A:
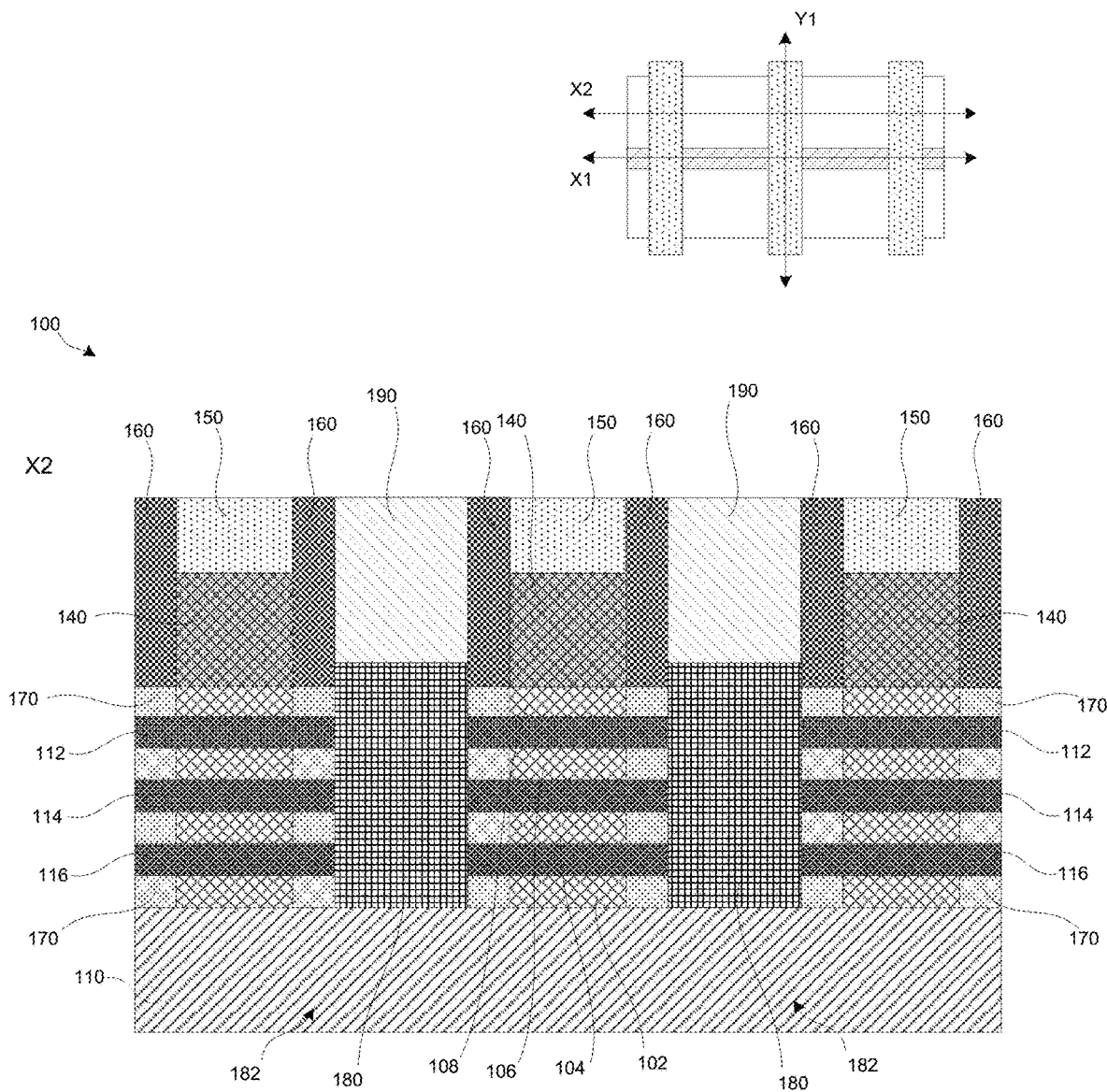
Figure 5B:
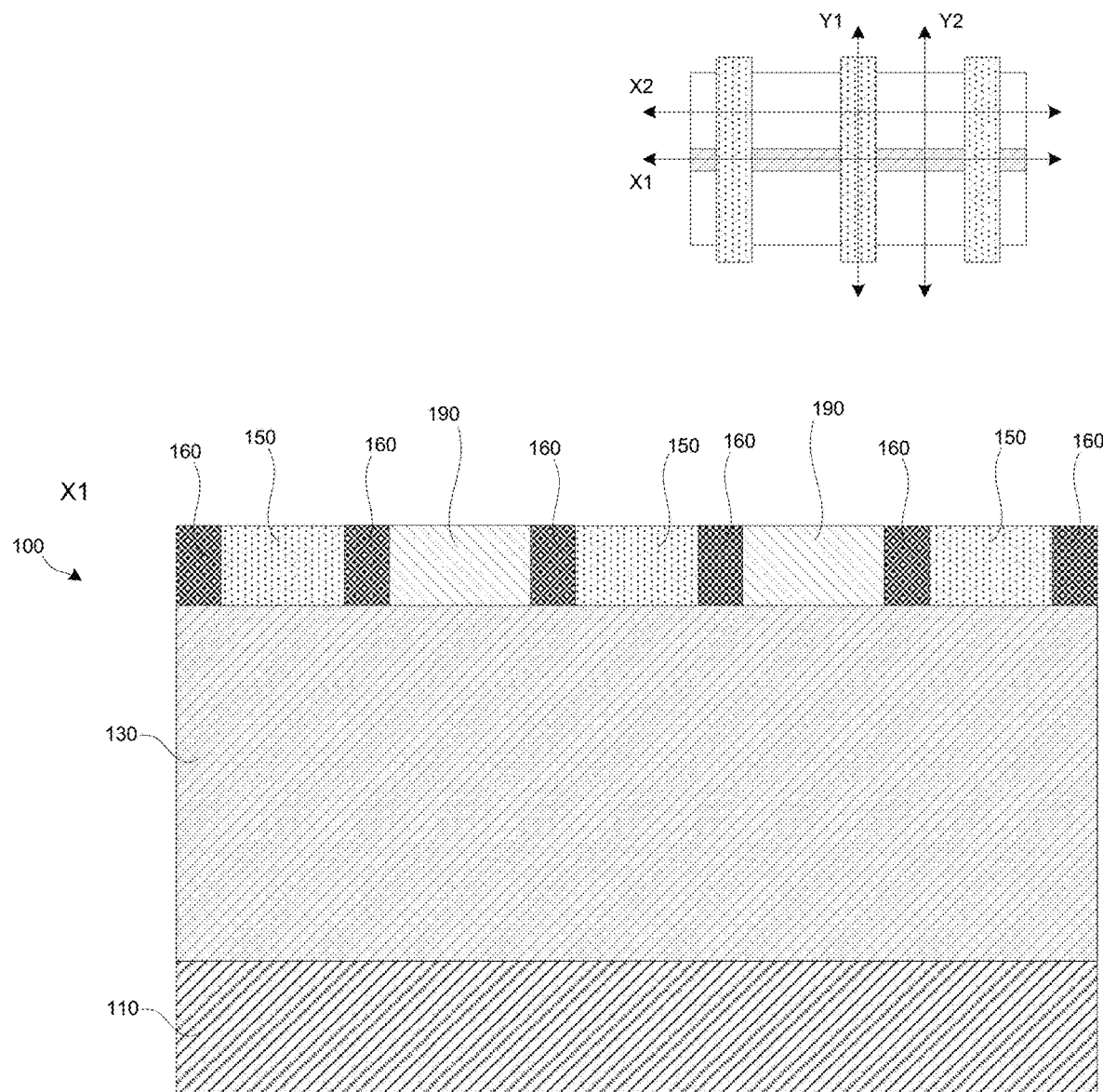

FIG. 5 depicts cross-sectional view of a semiconductor structure shown after a fabrication operation, taken along plane Y1, in accordance with one or more embodiments. During the present fabrication stage, gate mask 150 may be formed upon the planarized upper surface of the sacrificial gate 140 and the upper surface of the dielectric pillar 130. Gate mask 150 may be formed by depositing mask material, such as a hard mask material, in-line with the sacrificial gate 140 upon the planarized upper surface of the sacrificial gate 140 and the upper surface of the dielectric pillar 130.

Gate mask 150 may be composed of one or more layers masking materials to protect sacrificial gate 140 and/or other underlying materials during subsequent processing of structure 100. In particular, gate mask 126 can include, e.g., a silicon nitride, silicon oxide hard mask, or combination of both (indicated with different cross hatching).

According to an example, each sacrificial gate 140 with gate mask 150 thereupon, can have a height of between approximately 50 nm and approximately 200 nm, and a length of between approximately 15 nm and approximately 200 nm.

Figure 6A:
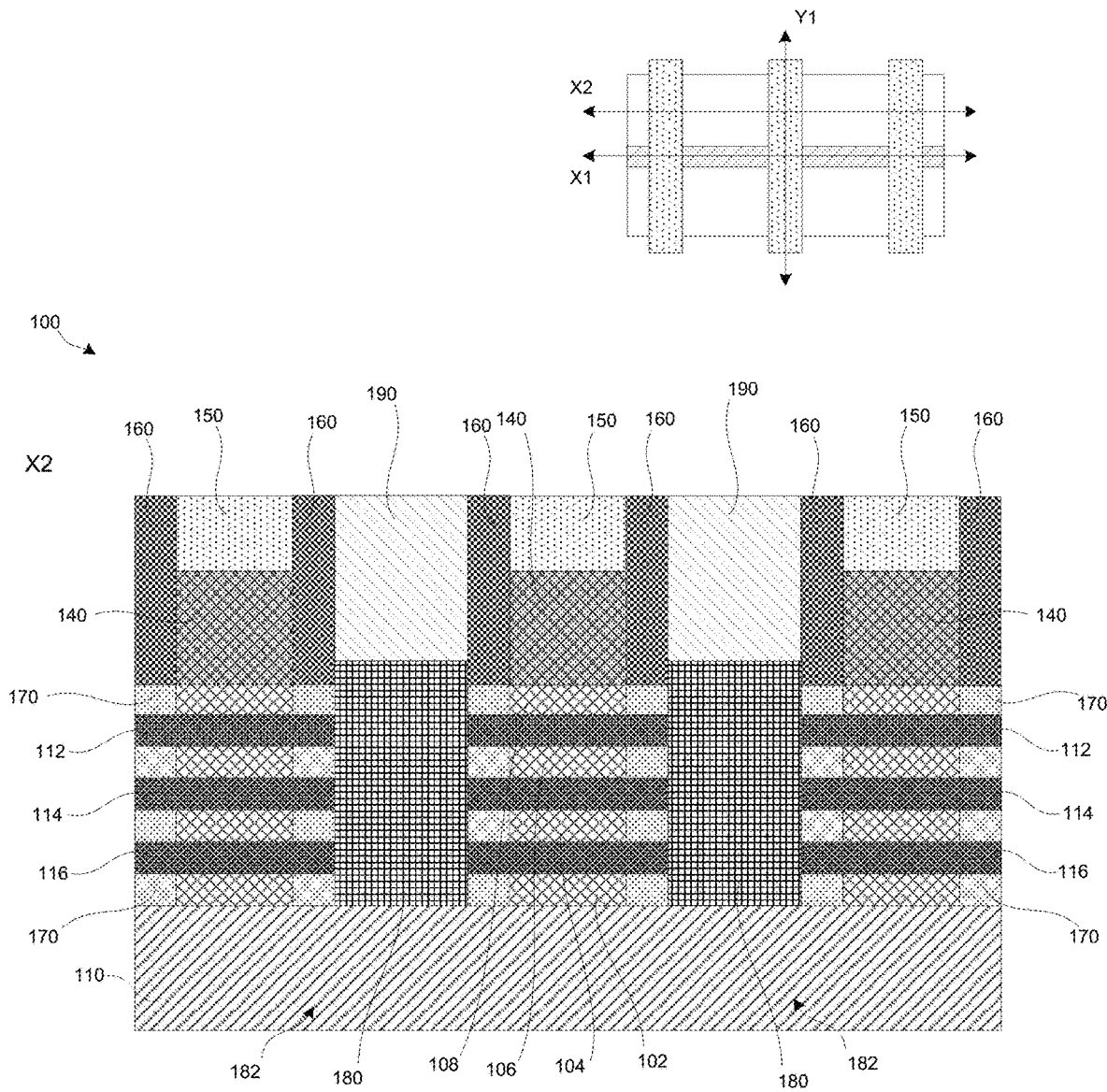
FIG. 6A depicts cross-sectional view of the semiconductor structure shown after a fabrication operation, taken along plane X2, in accordance with one or more embodiments.
Figure 6B:
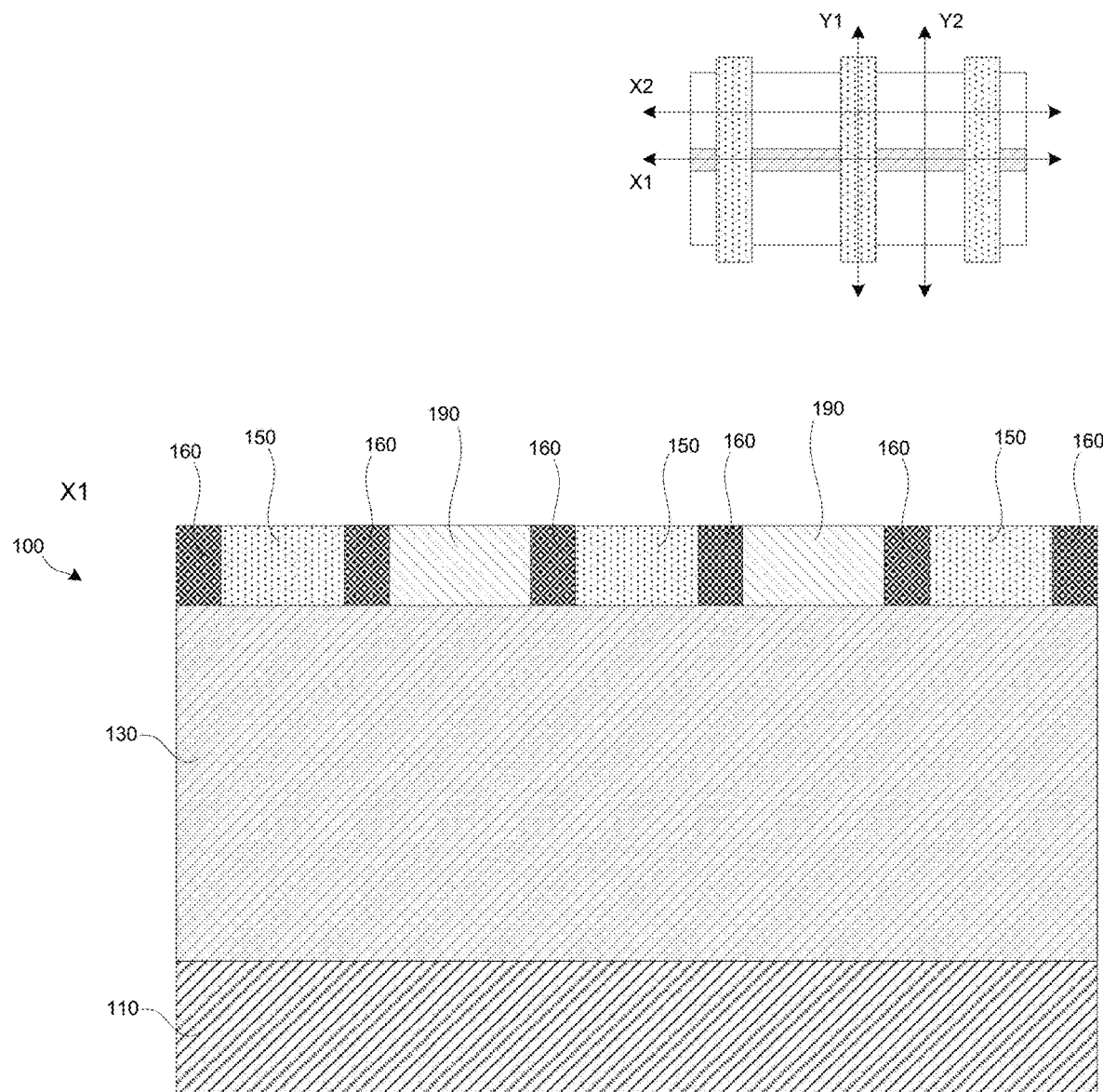
FIG. 6B depicts cross-sectional view of the semiconductor structure shown after a fabrication operation, taken along plane X1, in accordance with one or more embodiments.

FIG. 6A depicts cross-sectional view of semiconductor structure 100, taken along plane X1 and FIG. 6B depicts cross-sectional view of semiconductor structure 100, taken along plane X2, shown after a fabrication operation, in accordance with one or more embodiments. During the present fabrication stages, gate spacers 160 may be formed, channel nanosheets may be exposed, channel nanosheet spacers 170 may be formed, source/drain regions 180, 182 may be formed, and inter-layer dielectric (ILD) 190 may be formed. ILD 190 be formed with any suitable dielectric materials, including but not limited to, silicon oxide, carbon doped silicon oxide, fluorine doped silicon oxide, a low-k dielectric (k is the relative dielectric constant and low-k means a k value less than 5). In some embodiments, the ILD 190 comprises multiple dielectric materials such as a silicon nitride liner and silicon oxide fill.

Plane X2 is defined as a cross-sectional plane across the width of one or more forksheet gates, as is depicted.

Gate spacers 160 may laterally abut sacrificial gate 140 and gate mask 160. Gate spacers 160 may be formed, e.g., by a combination of deposition and etching, over the initial structure of nanosheet stack and laterally adjacent to sacrificial gate 140 and gate mask 160. Gate spacers 160 may be comprised of a variety of different materials, such as silicon nitride, SiBCN, SiNC, SiN, SiCO, and SiNOC, etc., and they may each be made of the same or different materials.

The channel nanosheets may be exposed by laterally recessing alternating nanosheets (e.g., sacrificial nanosheets 102, 104, 106) to yield a plurality of recesses in each nanosheet stack. The lateral recessing of alternating nanosheets can be provided, e.g., by application of a wet etchant selective to the composition of sacrificial nanosheets 102, 104, 106 (e.g., SiGe or similar crystalline semiconductors), and which leaves other structures (e.g., substrate 110, channel nanosheets 112, 114, and 116, etc.) substantially intact.

Channel nanosheet spacers 170 may be formed by depositing an insulative material, such as a dielectric, can be deposited to pinch off these previously formed recesses to yield a channel nanosheet spacer 170 positioned therewithin, (e.g., between alternating channel nanosheets 112, 114, and 116 within the nanosheet stack). Channel nanosheet spacer 170 can be positioned laterally adjacent to sacrificial nanosheets 102, 104, 106 of each nanosheet stack 114, vertically between channel nanosheets 112, 114, and 116 of each nanosheet stack, vertically between channel nanosheets 112 and gate spacer 160, and vertically between channel nanosheets 116 and substrate 110.

Source/drain (S/D) regions 180 are generally located in pMOS side 120 and S/D regions 182 are generally formed in nMOS side 120'.

S/D regions 180 and/or S/D regions 182 may be formed by epitaxially growing a source/drain epitaxial region between respective pairs of nanosheet stacks, e.g., from exposed sidewalls of channel nanosheets 112, 114, and 116 and upper surface of substrate 110 or a mandrel (not shown) formed thereupon. In some embodiments, the S/D is formed by in-situ doped epitaxial growth. In some embodiments, epitaxial growth and/or deposition processes may be selective to forming on semiconductor surfaces, and may not deposit material on dielectric surfaces, such as silicon dioxide or silicon nitride surfaces (e.g., nanosheet stacks, channel nanosheet spacers 170, gate spacers 160, etc.).

Suitable n-type dopants include but are not limited to phosphorous (P), and suitable p-type dopants include but are not limited to boron (B). The use of an in-situ doping process is merely an example. For instance, one may instead employ an ex-situ process to introduce dopants into the source and drains. Other doping techniques can be used to incorporate dopants in the bottom source/drain region. Dopant techniques include but are not limited to, ion implantation, gas phase doping, plasma doping, plasma immersion ion implantation, cluster doping, infusion doping, liquid phase doping, solid phase doping, in-situ epitaxy growth, or any suitable combination of those techniques. In preferred embodiments the source drain epitaxial growth conditions that promote in-situ boron doped SiGe for pMOS and phosphorus or arsenic doped silicon or Si:C for nMOS. The doping concentration in S/D can be in the range of $1\times10^{19}$ $cm^{-3}$ to $2\times10^{21}$ $cm^{-3}$, or preferably between $2\times10^{20}$ $cm^{-3}$ to $7\times10^{20}$ $cm^{-3}$.

ILD 190 may be formed by depositing an appropriate dielectric material, as is known in the art, upon S/D regions 180 and upon S/D regions 182 and upon gate spacers 160 associated with neighboring nanosheet stacks.

Figure 7A:
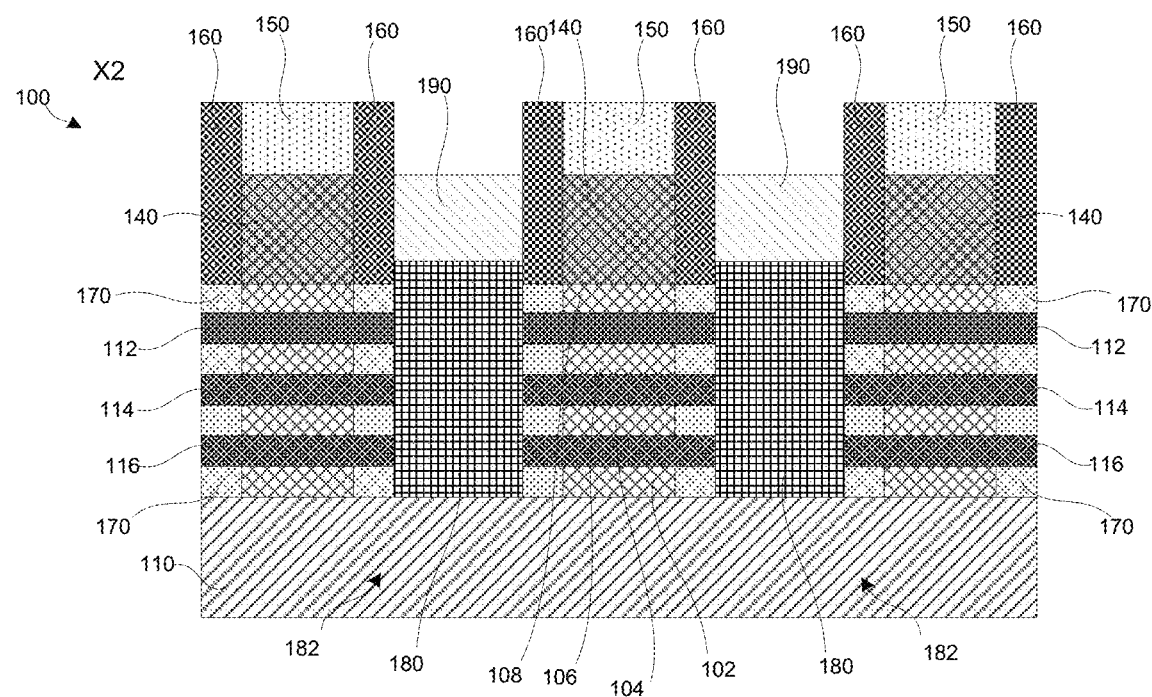
FIG. 7A depicts cross-sectional view of the semiconductor structure shown after a fabrication operation, taken along plane X2, in accordance with one or more embodiments.
Figure 7B:
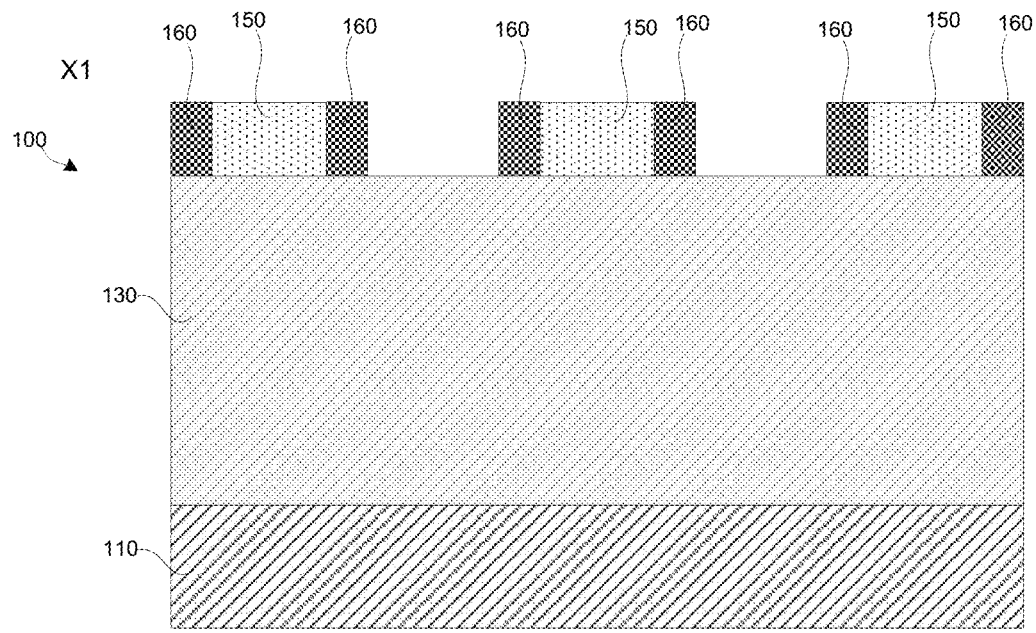
FIG. 7B depicts cross-sectional view of the semiconductor structure shown after a fabrication operation, taken along plane X1, in accordance with one or more embodiments.

FIG. 7A depicts cross-sectional view, taken along plane X2, of the semiconductor structure 100 and FIG. 7B depicts cross-sectional view, taken along plane X1, of the semiconductor structure 100, shown after a fabrication operation. During the present fabrication stage, ILD 190 is partially recessed to expose portions of the upper surface of dielectric pillar 130 that are not covered by a sacrificial gate structure (e.g. sacrificial gate 140, gate mask 150, and gate spacers 160).

ILD 190 may be partially recessed by a selective etch process that removes a thickness of ILD 190 material selective to a particular surface, such as the bottom surface of gate mask 150, so as to expose the upper surface of dielectric pillar 130 that is not covered by gate masks 150 or gate spacers 160.

Figure 8A:
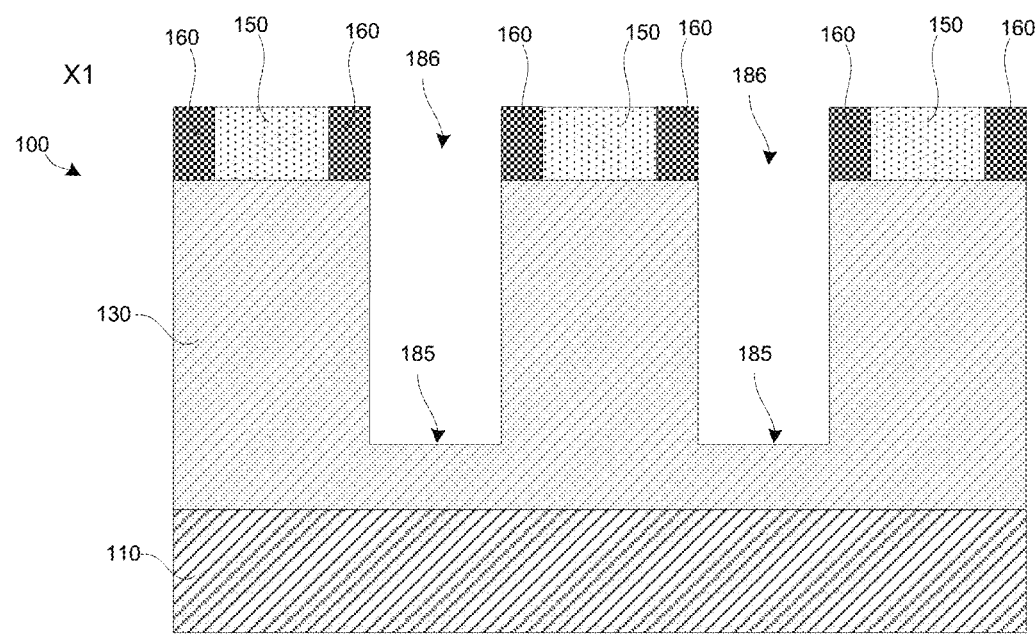
FIG. 8A depicts cross-sectional view of the semiconductor structure shown after a fabrication operation, taken along plane X1, in accordance with one or more embodiments.
Figure 8B:
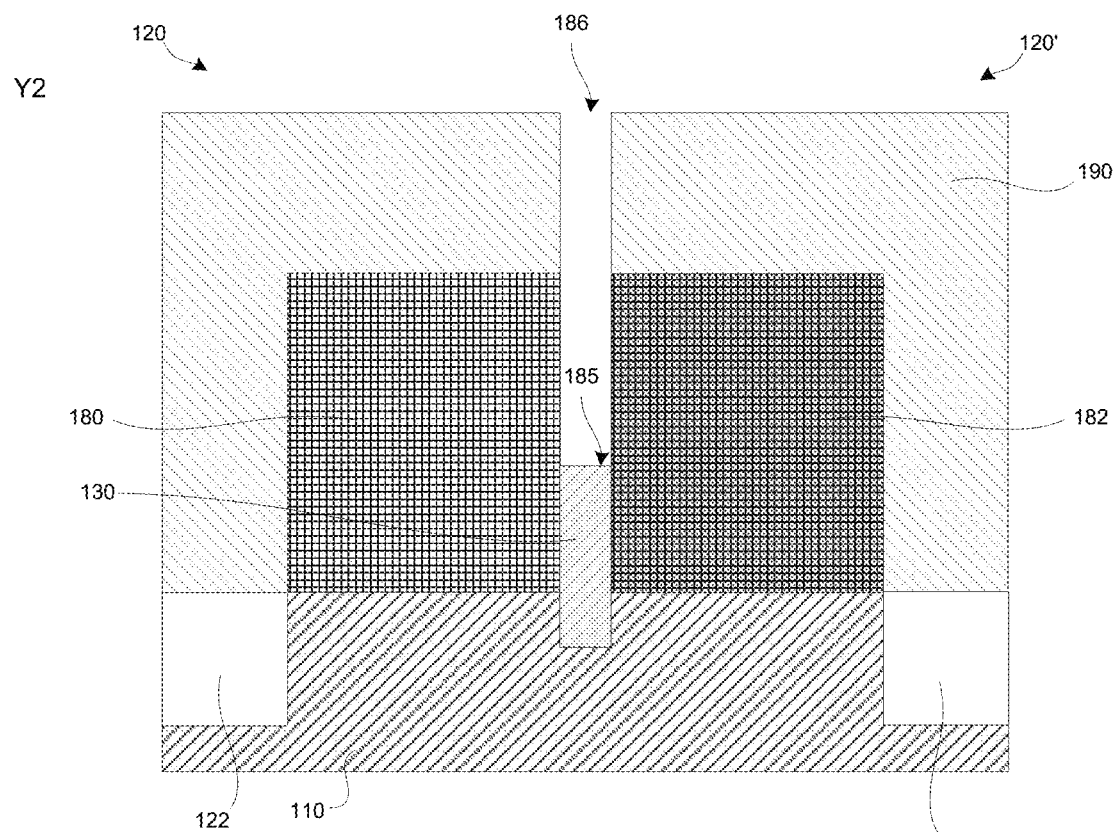
FIG. 8B depicts cross-sectional view of the semiconductor structure shown after a fabrication operation, taken along plane Y2, in accordance with one or more embodiments.

FIG. 8A depicts cross-sectional view, taken along plane X1, of the semiconductor structure 100 and FIG. 8B depicts cross-sectional view, taken along plane Y2, of the semiconductor structure 100, shown after a fabrication operation. During the present fabrication stage, dielectric pillar 130 is partially recessed to form trench 186.

Plane Y2 is a cross section plane of source drain regions between neighboring gates, as is depicted for example in FIG. 6B.

Dielectric pillar 130 may be partially recessed by a selective etch process that removes portions of dielectric pillar 130. The removal of portions dielectric pillar 130 may be self-aligned to neighboring gates (e.g., gate spacers 160, or the like) and timed to achieve the desired depth. In a particular implementation, as shown, portions of dielectric pillar 130 may be removed so as to form a trench bottom surface 185 that is between the bottom surface and top surface of source/drain region 180, 182, respectively. In another particular implementation, portions of dielectric pillar 130 may be removed so as to form a trench bottom surface 185 that is above the top surface of source/drain region 180, 182, respectively. In another particular implementation, portions of dielectric pillar 130 may be removed so as to form a trench bottom surface 185 that exposes the substrate 110.

The removal of portions of dielectric pillar 130 may be selective to a particular surface or structures, such as such as the gate hard mask 150, ILD 190, source/drain regions 180, 182, etc.

Figure 9A:
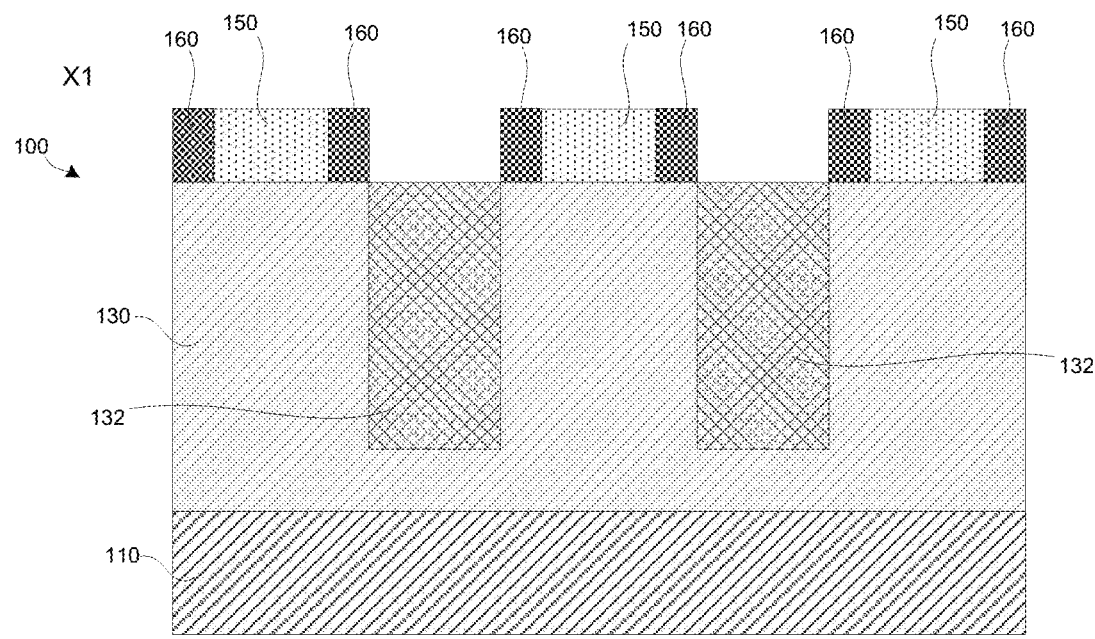
FIG. 9A depicts cross-sectional view of the semiconductor structure shown after a fabrication operation, taken along plane X1, in accordance with one or more embodiments.
Figure 9B:
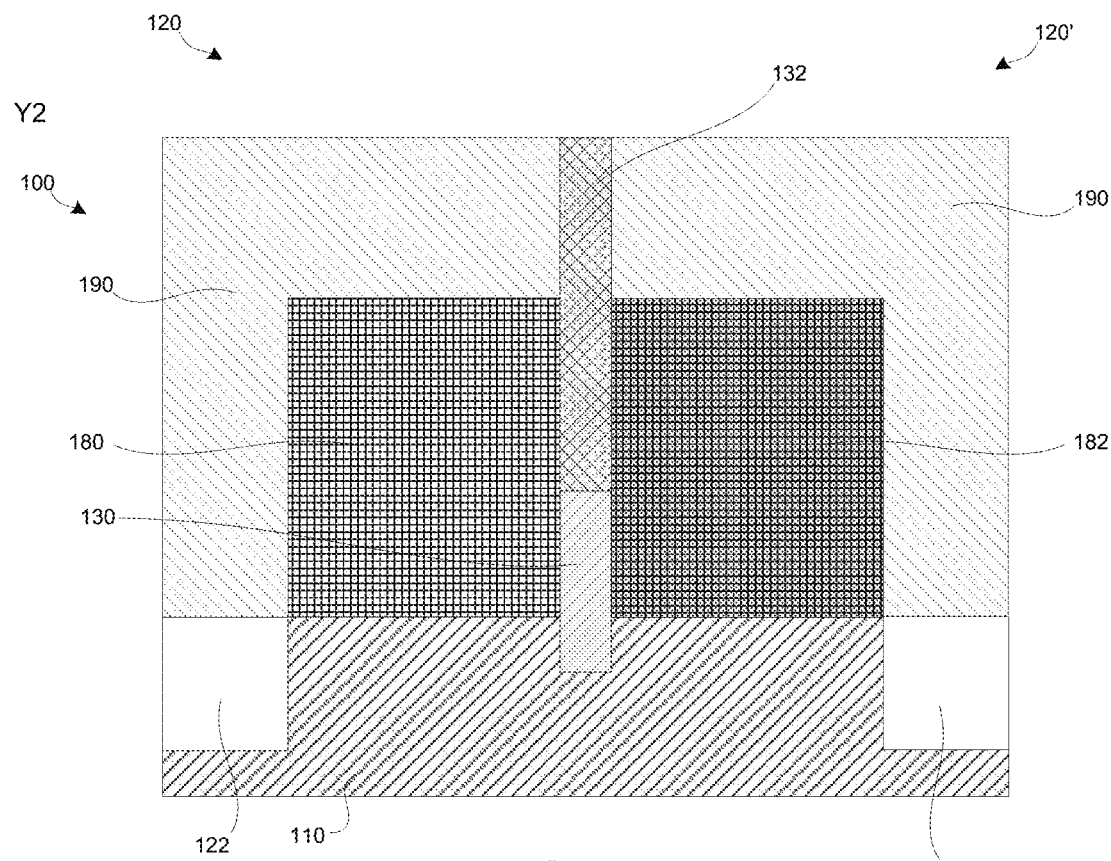
FIG. 9B depicts cross-sectional view of the semiconductor structure shown after a fabrication operation, taken along plane Y2, in accordance with one or more embodiments.

FIG. 9A depicts cross-sectional view, taken along plane X1, of the semiconductor structure 100 and FIG. 9B depicts cross-sectional view, taken along plane Y2, of the semiconductor structure 100, shown after a fabrication operation. During the present fabrication stage, second dielectric 132 is formed within trench 186.

Second dielectric 132 material may be formed within dielectric pillar 130 by depositing a second dielectric material different than the first dielectric material of dielectric pillar 130, upon dielectric pillar 130 and upon ILD 190 within trench 186. At such, subsequent to the formation of second dielectric 132, dielectric pillar 130 comprises the first dielectric and the second dielectric 132, and as such may be referred to herein as a dual dielectric pillar. This dual dielectric pillar 130 physically and, at least partially, electrically separates the respective nanosheet stacks within pMOS side 120 and within nMOS side 120'.

The second dielectric 132 is a different dielectric material relative to the first dielectric of pillar 130. The second dielectric 132 may be chosen to achieve etch selection relative thereto. Exemplary second dielectric 132 materials may be, but are not limited to: silicon nitride (SiN), silicon carbide (SiC), silicon oxynitride (SiON), carbon-doped silicon oxide (SiOC), silicon-carbon-nitride (SiCN), boron nitride (BN), silicon boron nitride (SiBN), silicoboron carbonitride (SiBCN), silicon oxycabonitride (SiOCN), silicon oxide, and combinations thereof. The second dielectric 132 can be a low-k material having a dielectric constant less than about 7, less than about 5. The dielectric and can be formed by any suitable techniques such as deposition followed by directional etch. After deposition, excessive second dielectric 132 material can be removed by etching back or polish process.

As is depicted in FIG. 9A, the dual dielectric pillar 130 may include the first dielectric material in regions in line with the gates (e.g., first dielectric material is directly below the gate mask 150 and gate spacers 160 of the inline forksheet gate). The dual dielectric pillar 130 may include the second dielectric 132 is regions in line with the source/drain 180 in pMOS side 120 with the source/drain 182 in the nMOS side 120'.

Figure 10A:
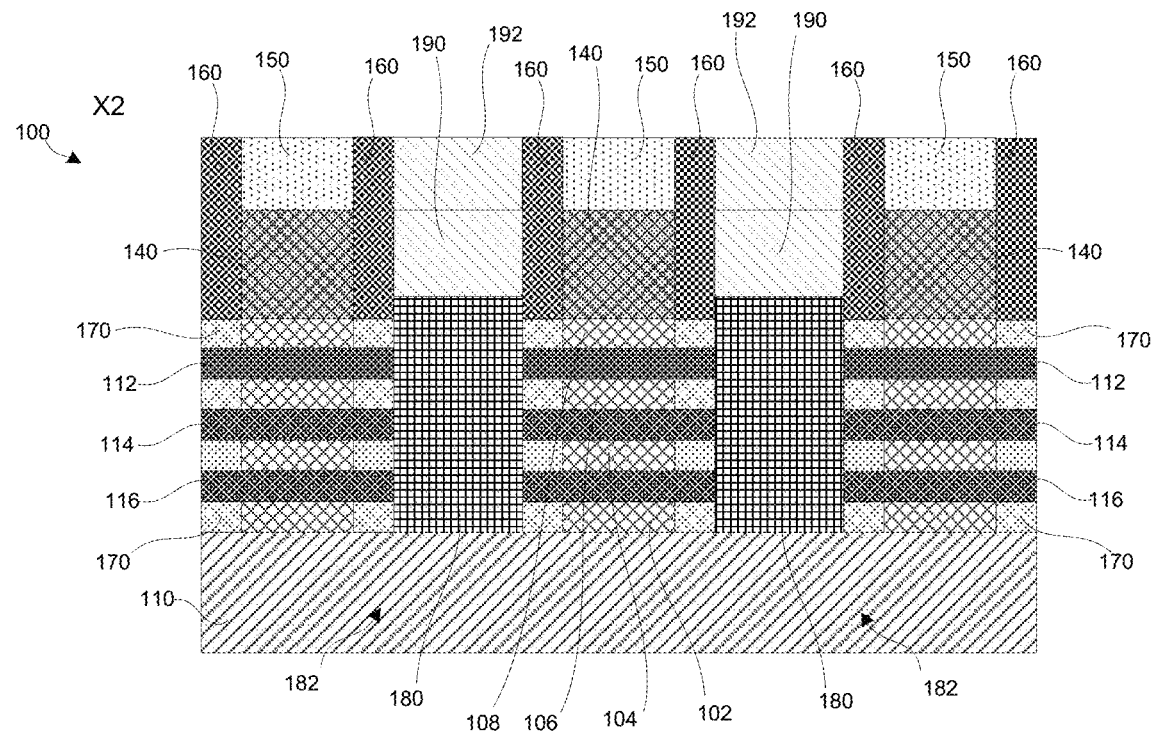
FIG. 10A depicts cross-sectional view of the semiconductor structure shown after a fabrication operation, taken along plane X2, in accordance with one or more embodiments.
Figure 10B:
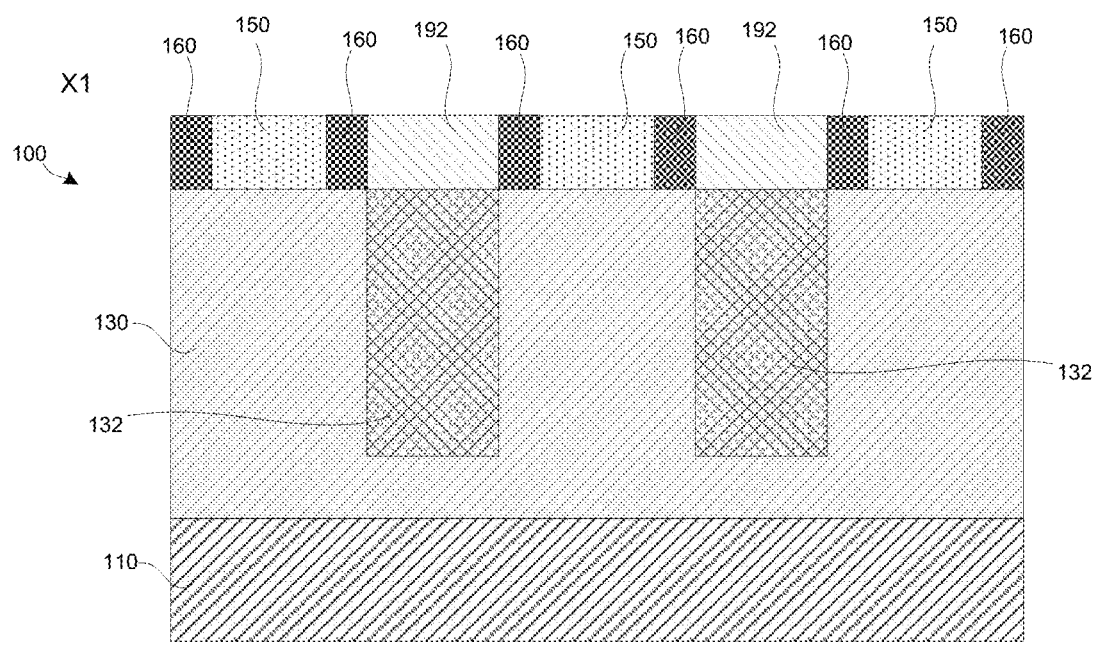
FIG. 10B depicts cross-sectional view of the semiconductor structure shown after a fabrication operation, taken along plane X1, in accordance with one or more embodiments.
Figure 10C:
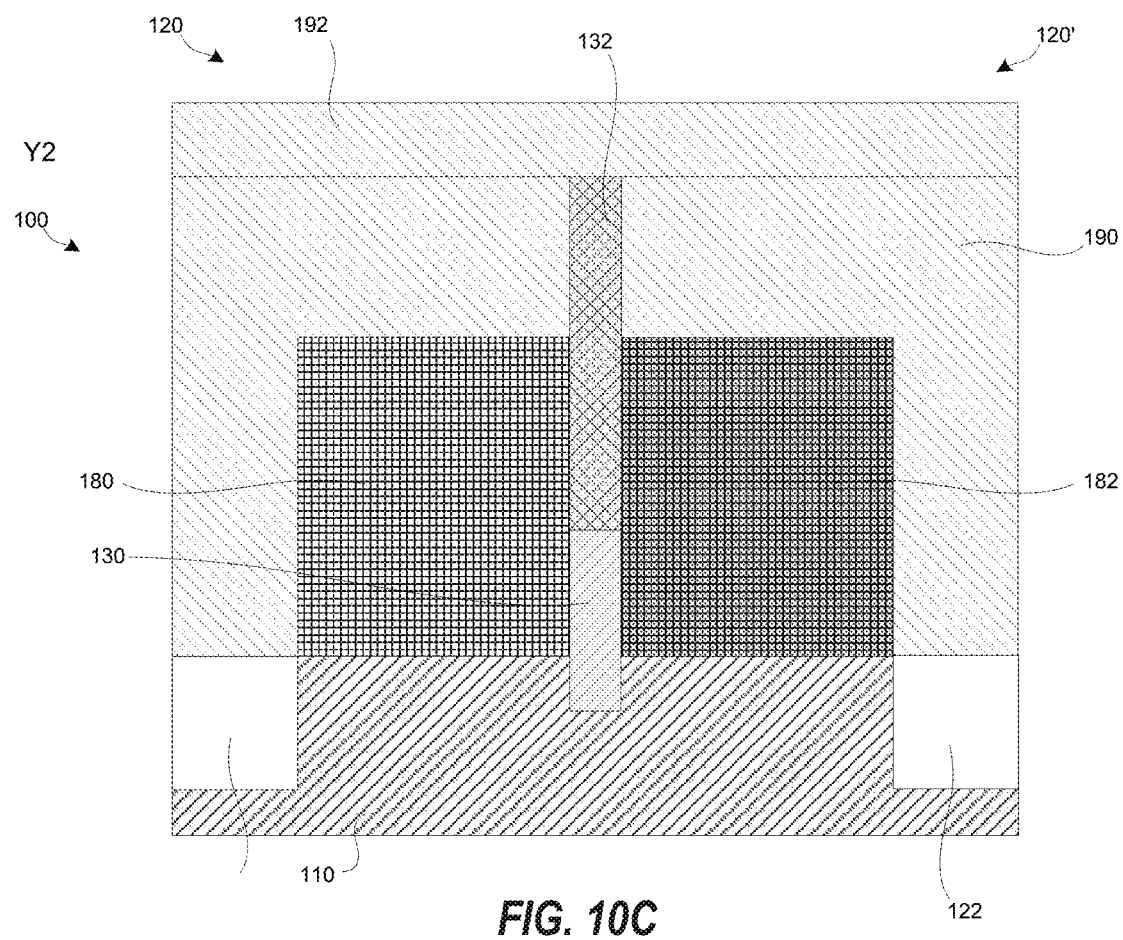
FIG. 10C depicts cross-sectional view of the semiconductor structure shown after a fabrication operation, taken along plane Y2, in accordance with one or more embodiments.

FIG. 10A depicts cross-sectional view, taken along plane X2, of the semiconductor structure 100, FIG. 10B depicts cross-sectional view, taken along plane X1, of the semiconductor structure 100, and FIG. 10C depicts cross-sectional view, taken along plane Y2, of the semiconductor structure 100, shown after a fabrication operation. During the present fabrication stage, ILD 192 is formed upon ILD 190 and upon second dielectric 132 between neighboring gate spacers 160.

ILD 192 may formed by depositing an appropriate dielectric material, directly upon ILD 190 and directly upon second dielectric 132 between neighboring gate spacers 160. Subsequently, a CMP may planarize the respective top surfaces of the gate spacers 160, gate mask 150, and ILD 192. The ILD 192 be formed with any suitable dielectric materials, including but not limited to, silicon oxide, carbon doped silicon oxide, fluorine doped silicon oxide, a low-k dielectric (k is the relative dielectric constant and low-k means a k value less than 5). In some embodiments, the ILD 192 comprises multiple dielectric materials such as a silicon nitride liner and silicon oxide fill.

Figure 11A:
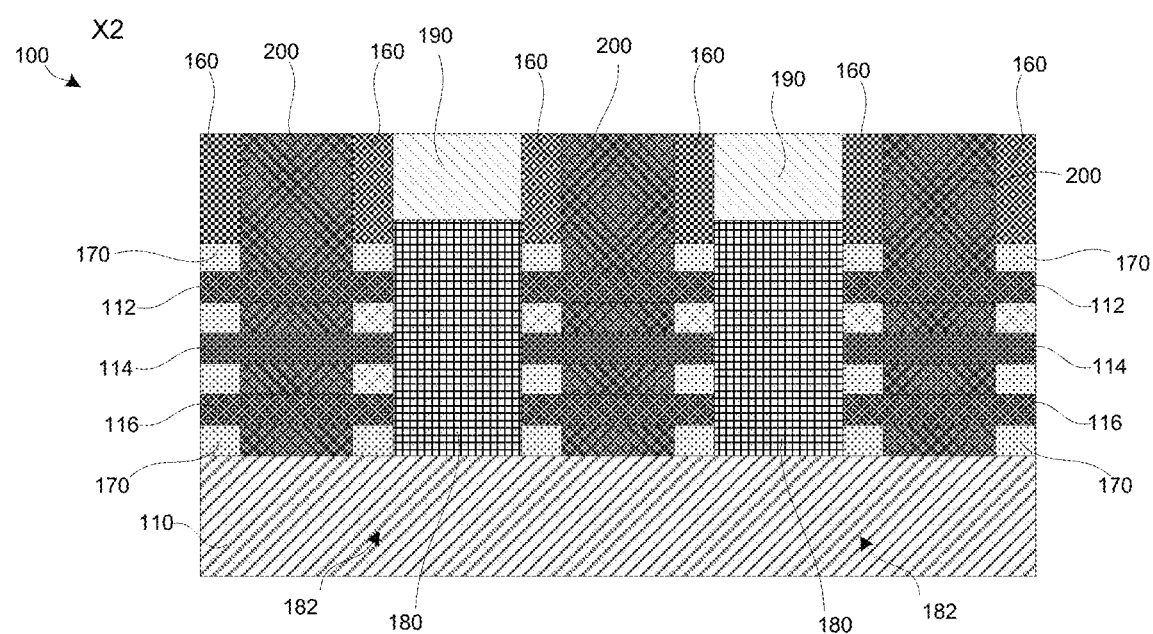
FIG. 11A depicts cross-sectional view of the semiconductor structure shown after a fabrication operation, taken along plane X2, in accordance with one or more embodiments.
Figure 11B:
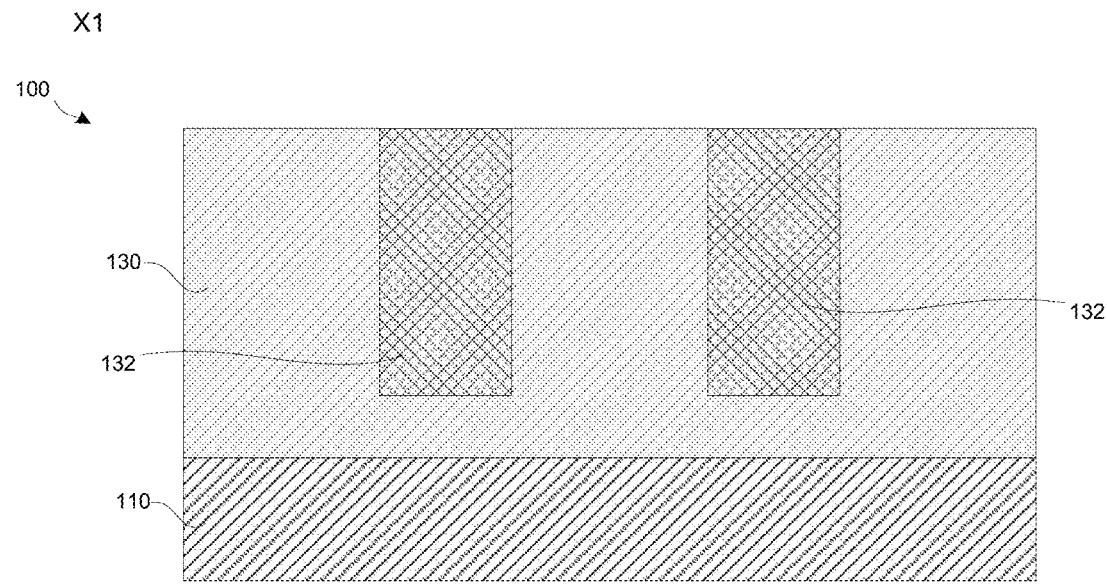
FIG. 11B depicts cross-sectional view of the semiconductor structure shown after a fabrication operation, taken along plane X1, in accordance with one or more embodiments.
Figure 11C:
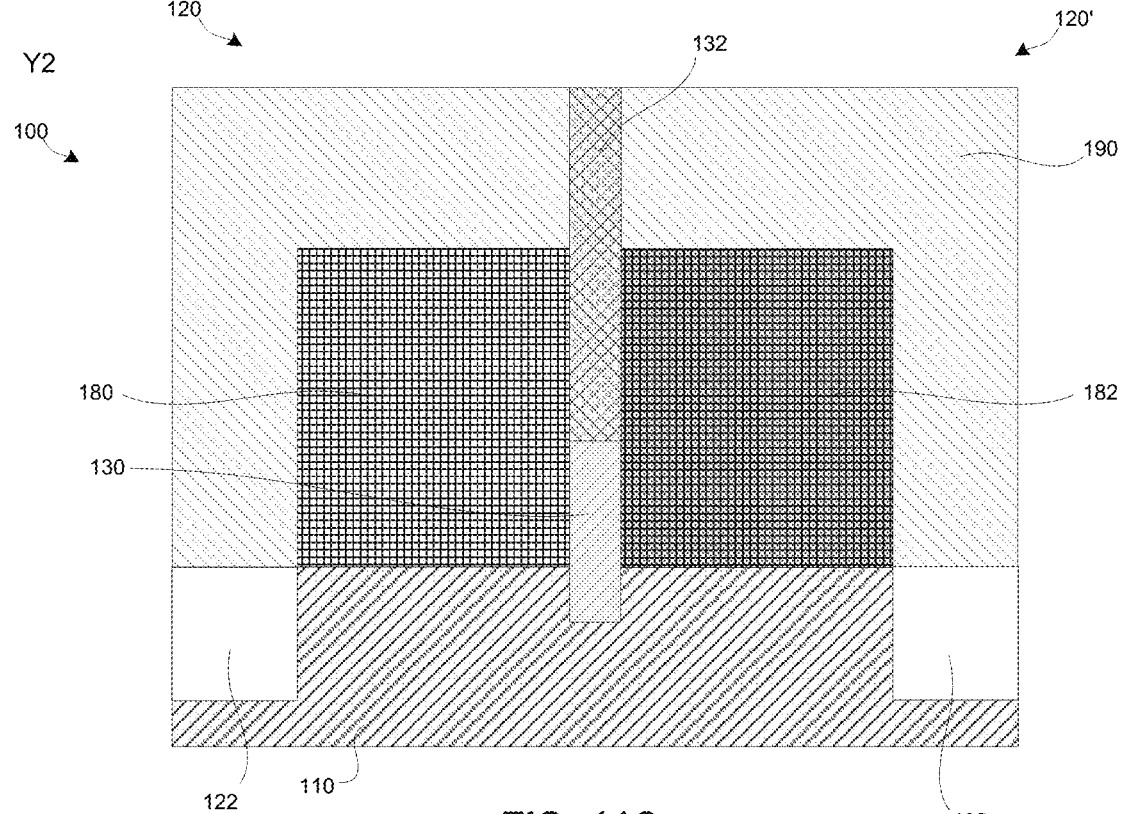
FIG. 11C depicts cross-sectional view of the semiconductor structure shown after a fabrication operation, taken along plane Y2, in accordance with one or more embodiments.
Figure 11D:
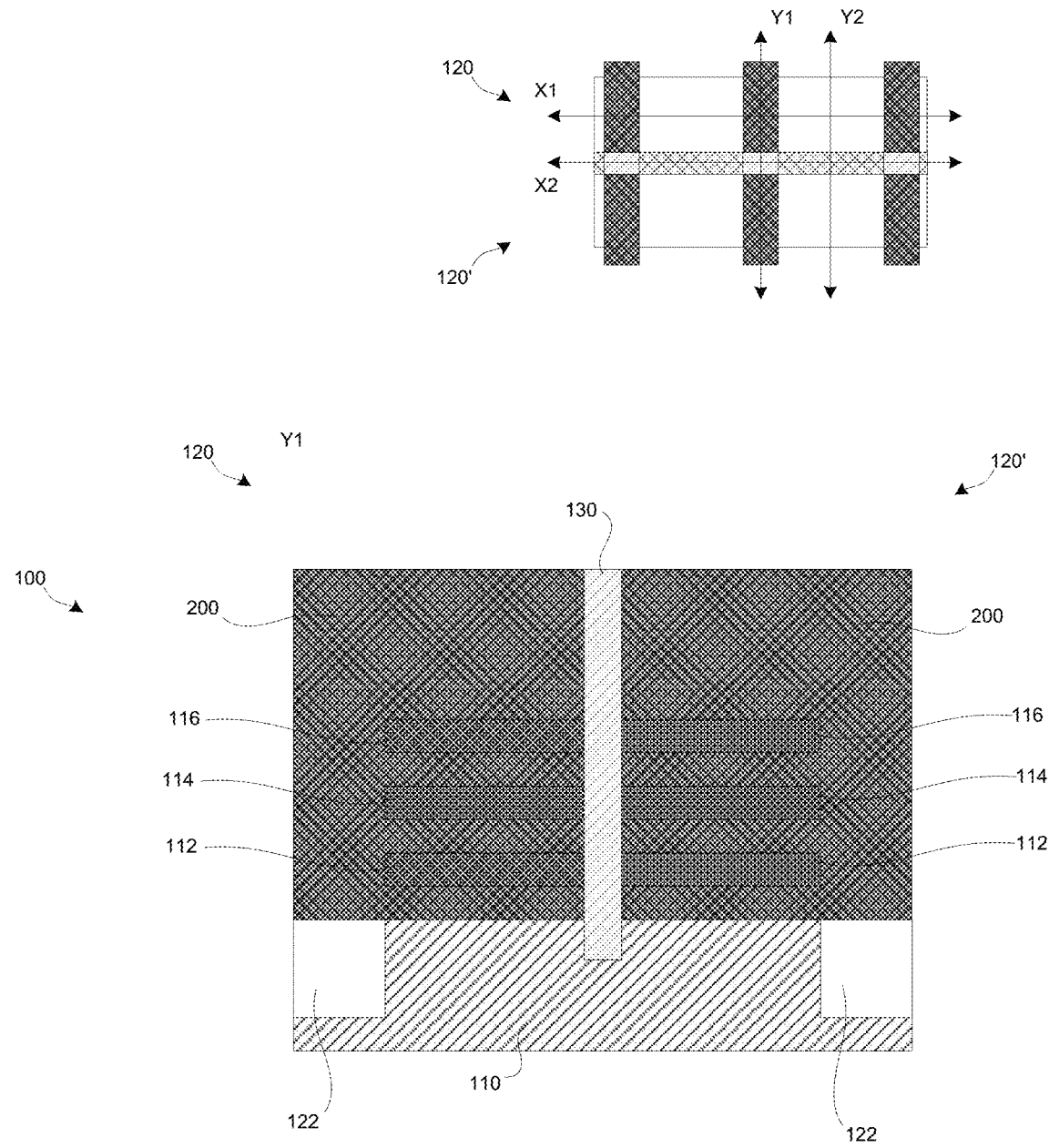
FIG. 11D depicts cross-sectional view of the semiconductor structure shown after a fabrication operation, taken along plane Y1, in accordance with one or more embodiments.

FIG. 11A depicts cross-sectional view, taken along plane X2, of the semiconductor structure 100, FIG. 11B depicts cross-sectional view, taken along plane X1, of the semiconductor structure 100, FIG. 11C depicts cross-sectional view, taken along plane Y2, and FIG. 11D depicts cross-sectional view, taken along plane Y1, of the semiconductor structure 100, shown after a fabrication operation. During the present fabrication stages, channel nanosheets are processed and replacement gate 200 are formed. The channel nanosheets may be processed and replacement gates 200 may be formed by exposing and removing the sacrificial gates 140, removing the remaining sacrificial nanosheets 102, 104, 106, 108 in the gate region, forming replacement gates 200 around the exposed portions of the channel nanosheets 112, 114, and 116 in the gate region. The retained channel nanosheets 112, 114, and 116 during the present fabrication stage may be referred herein as channel nanosheet stacks, nanosheets stacks, or the like.

Each replacement gate 200 can comprise a gate dielectric and gate conductor(s). Gate dielectric can comprise any suitable dielectric material, including but not limited to silicon oxide, silicon nitride, silicon oxynitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k may further include dopants such as lanthanum, aluminum, magnesium. The gate dielectric material can be formed by any suitable deposition process or the like. In some embodiments, the gate dielectric has a thickness ranging from 1 nm to 5 nm, although less thickness and greater thickness are also conceived. Gate conductor can comprise any suitable conducting material, including but not limited to, doped polycrystalline or amorphous silicon, germanium, silicon germanium, a metal (e.g., tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), gold (Au), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide (RuO2), cobalt silicide (CoSi), nickel silicide (NiSi)), transition metal aluminides (e.g. Ti3Al, ZrAl), TaC, TaMgC, carbon nanotube, conductive carbon, graphene, or any suitable combination of these materials. The conductive material may further comprise dopants that are incorporated during or after deposition. In some embodiments, the gate may further comprise a workfunction setting layer between the gate dielectric and gate conductor. The workfunction setting layer can be a workfunction metal (WFM). WFM can be any suitable material, including but not limited a nitride, including but not limited to titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC) titanium aluminum carbide (TiAlC), tantalum carbide (TaC), hafnium carbide (HfC), and combinations thereof. In some embodiments, a conductive material or a combination of multiple conductive materials can serve as both gate conductor and WFM. The gate conductor and WFM can be formed by any suitable process or any suitable combination of multiple processes, including but not limited to, atomic layer deposition (ALD), chemical vapor deposition (CVD), physical vapor deposition (PVD), sputtering, plating, evaporation, ion beam deposition, electron beam deposition, laser assisted deposition, chemical solution deposition, etc.

Various known techniques may be utilized to form the nanosheets and replacement gates within the gate region. For example, sacrificial gates 140 may be exposed by removing portions of the gate spacers 160, gate mask 150, and ILD 192. Subsequently, the exposed sacrificial gates 140 may be removed between gate spacers 160 and inner spacers 170 to laterally expose the remaining sacrificial nanosheets 102, 104, 106, 108 in the gate region. Subsequently, the exposed sacrificial nanosheets 102, 104, 106, 108 may be removed laterally to expose the channel nanosheets 112, 114, and 116 in the gate region. The channel nanosheets 112, 114, and 116 may be processed by forming high-k layer may be formed around the exposed channel nanosheets 112, 114, and 116, and various one or more work function materials may be deposited upon the high-k dielectric, as is known in the art. Subsequently, replacement gates 200, such as metal gates, may be formed around the processed channel nanosheets 112, 114, and 116, upon the substrate 110, upon the SIT regions 122, and upon the first dielectric material of the dielectric pillar 130, between gates spacers 160 and inner spacers 170.

In some embodiments, sidewalls 135, depicted in FIG. 11B, of the first dielectric 130 may be coplanar with sidewalls 201 of the associated in line gate in the pMOS side 120 and nMOS side 120', respectively. For example, sidewalls 135 of the first dielectric 130 may be coplanar with sidewalls 201 of the associated in line gate 200 within side 120, 120', sidewalls 135 of the first dielectric 130 may be coplanar with sidewalls 201 of the gate spacers 160, 170 of the associated in-line gate 200 within side 120, 120', or the like.

As is shown in FIG. 11D, the formed replacement gate 200 may include two inline gate structures with a first gate structure located in pMOS side 120 and a second gate structure located in the nMOS side 120'. As depicted, these formed gates structures may be physically and, at least partially electrically, separated by the first dielectric material of the dielectric pillar 130. Relatedly, as is shown in FIG. 11C, source/drain region 180 in pMOS side 120 may be at least partially physically and partially electrically separated from source/drain region 182 in nMOS side 120', by the second dielectric material 132 of the dielectric pillar 130. Similarly, as is shown in FIG. 11C, ILD 190 in pMOS side 120 may be at least partially physically separated from ILD 190 in nMOS side 120', by the second dielectric material 132 of the dielectric pillar 130.

With reference to FIG. 11A, the term gate region may be utilized herein and refers to the region of structure 100 underneath or otherwise associated with gate 200. The generic term source/drain regions may be utilized herein and refers to the regions of structure 100 outside the footprint of gate 200. For example, the specific source/drain regions 180 may be formed in the generic source/drain regions in the pMOS side 120 and the specific source/drain regions 182 may be formed in the generic source/drain regions in the nMOS side 120'. The channel nanosheets 112, 114, and 116 are connected so such gate region and such source/drain regions so as to form a pFET or a nFET, respectively.

Figure 12A:
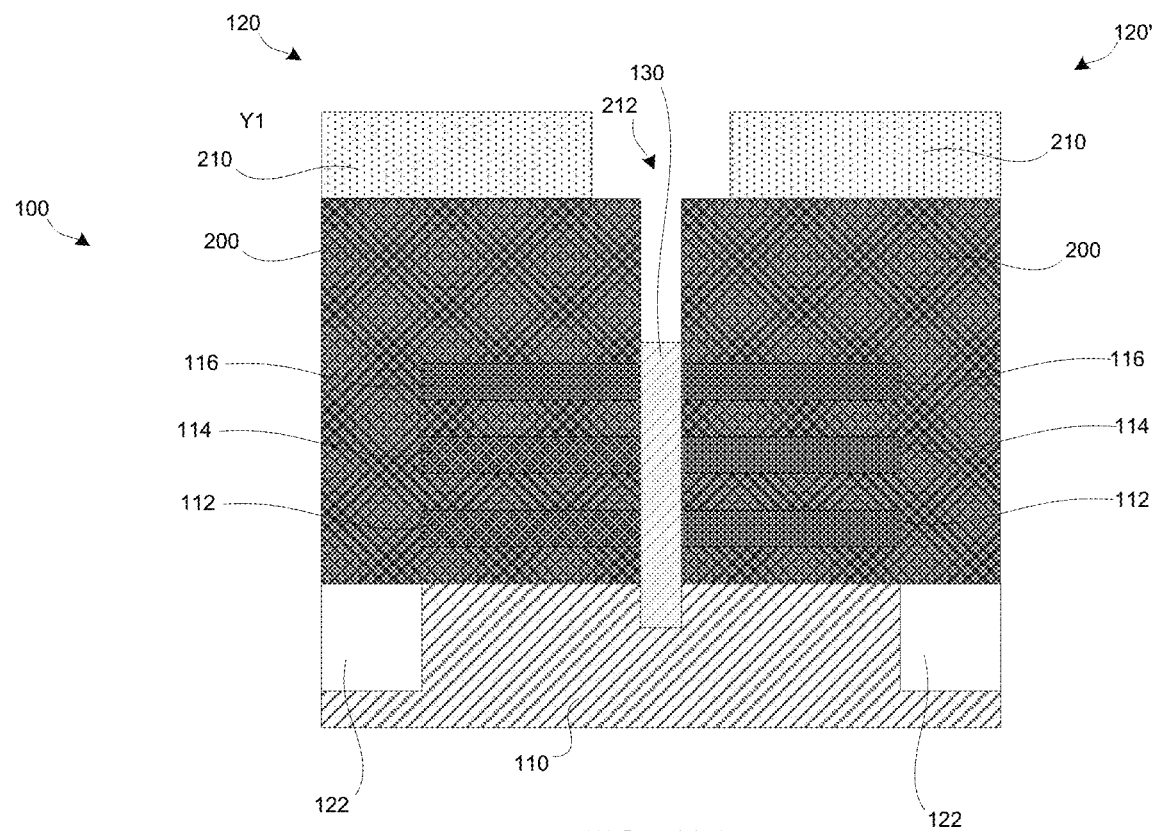
FIG. 12A depicts cross-sectional view of the semiconductor structure shown after a fabrication operation, taken along plane Y1, in accordance with one or more embodiments.
Figure 12B:
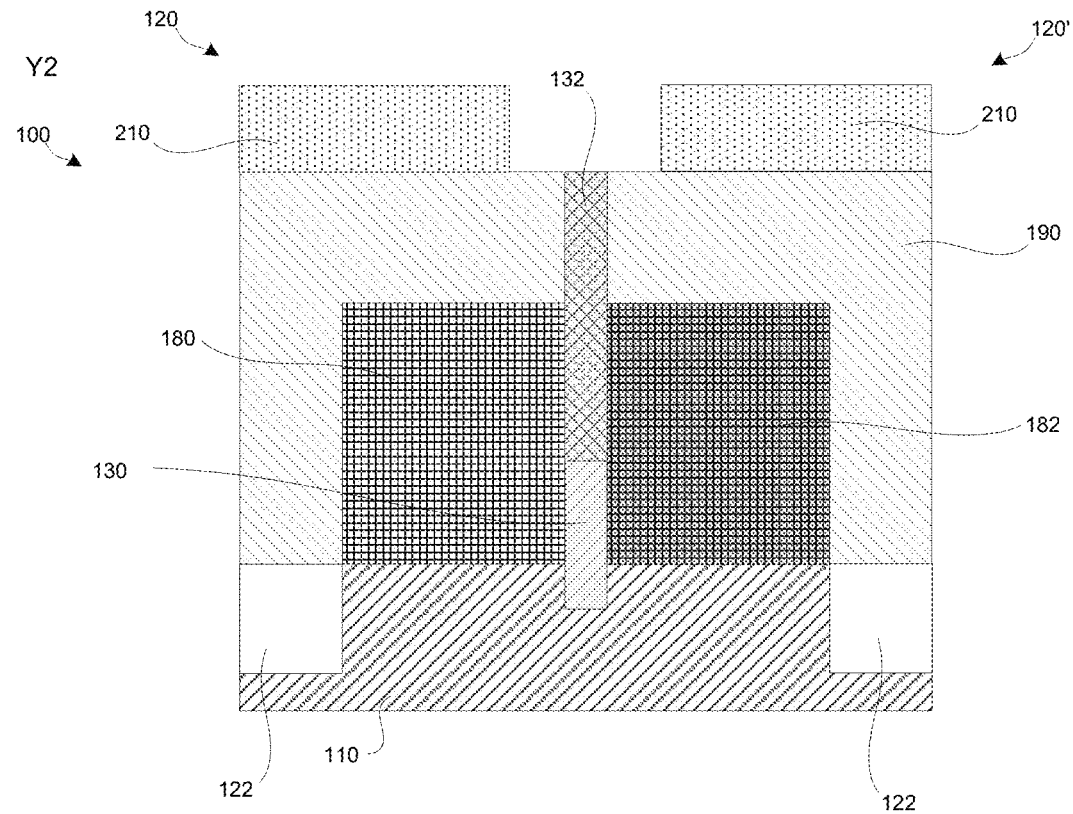
FIG. 12B depicts cross-sectional view of the semiconductor structure shown after a fabrication operation, taken along plane Y2, in accordance with one or more embodiments.

FIG. 12A depicts cross-sectional view, taken along plane Y1, and FIG. 12B depicts cross-sectional view, taken along plane Y2, of the semiconductor structure 100, shown after a fabrication operation. During the present fabrication stages, a gate connector mask 210 is formed upon the replacement gate(s) 200, portion(s) of the gate connector mask 210 are patterned to expose the dual dielectrics of the dual dielectric pillar 130 in locations associated with gates 200 that are to be connected across pMOS side 120 and nMOS side 120', and the exposed first dielectric material of the dual dielectric pillar 130 is removed selective to the retained exposed second dielectric material of the dual dielectric pillar 130 to form a gate trench 212 between gate 200 structure within pMOS side 120 and gate 200 structure within nMOS side 120'.

Due to etch selectivity between the first dielectric material and second dielectric material of the dual dielectric pillar 130, an isotropic etch may remove the first dielectric material of the dielectric pillar 130 to an adequate depth between the inline gate 200 structure within the pMOS side 120 from the gate 200 structure within the nMOS side 120', while advantageously limiting concerns of pillar 130 removal that would encroach upon a neighboring or adjacent gate 200.

Figure 13A:
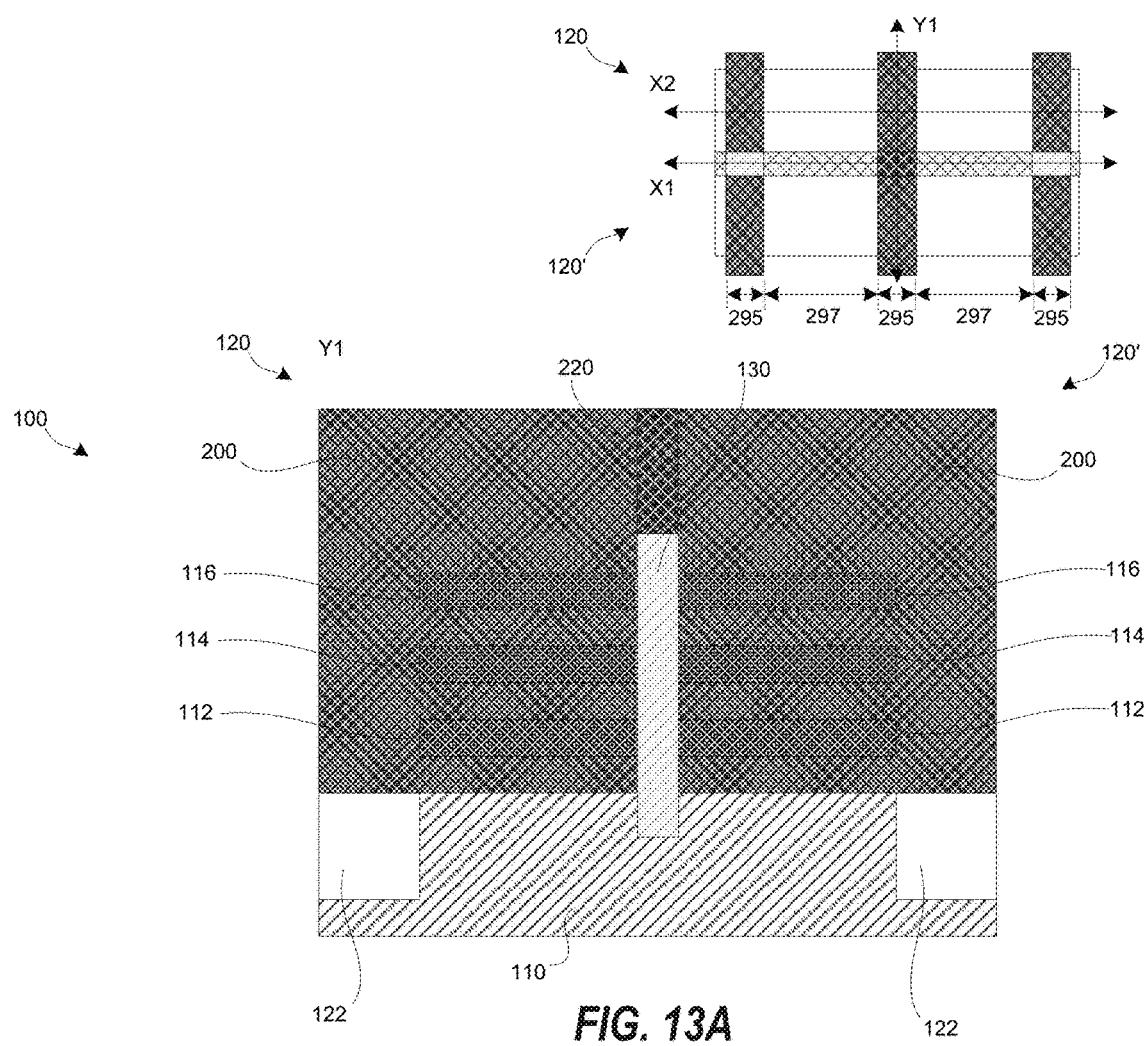
FIG. 13A depicts cross-sectional view of the semiconductor structure shown after a fabrication operation, taken along plane Y1, in accordance with one or more embodiments.
Figure 13B:
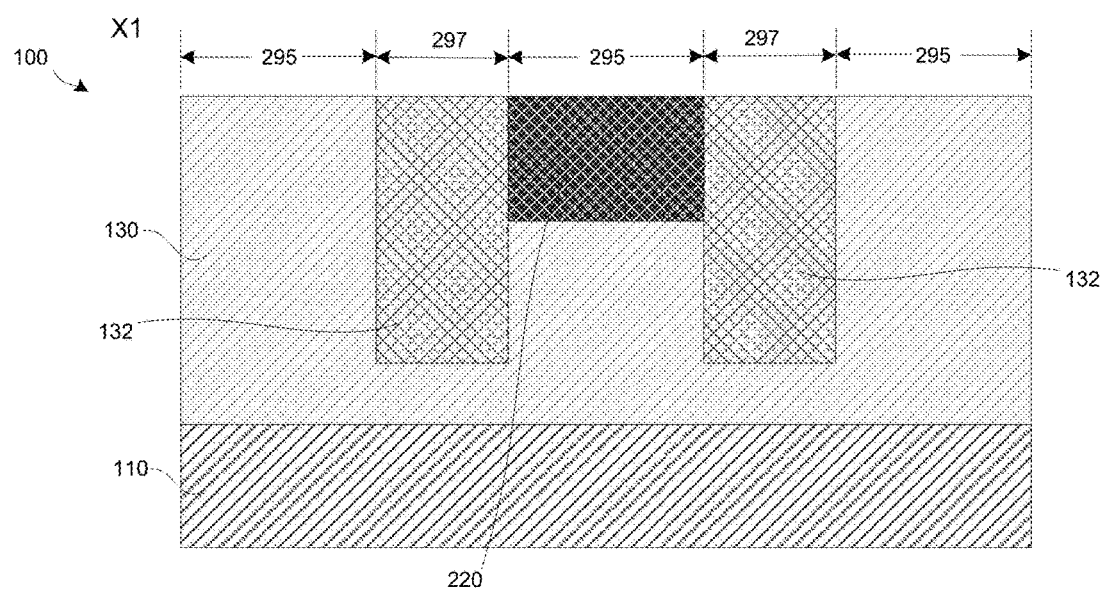
FIG. 13B depicts cross-sectional view of the semiconductor structure shown after a fabrication operation, taken along plane X1, in accordance with one or more embodiments.

FIG. 13A depicts cross-sectional view, taken along plane Y1, and FIG. 13B depicts cross-sectional view, taken along plane X1, of the semiconductor structure 100, shown after a fabrication operation. During the present fabrication stage, gate connector 220 is formed to physically and electrically connect the inline gate 200 structure within the pMOS side 120 from the gate 200 structure within the nMOS side 120'. Gate connector 220 may be formed by depositing or forming an electrically conductive material, such as a metal strap, within gate trench 212 between gate 200 structure within pMOS side 120 and gate 200 structure within nMOS side 120'. In this manner, gate connector 220 may be self-aligned to the second dielectric 132 of the dual dielectric pillar 130. Subsequently a CMP process may planarize the top surface of the gate 200, the top surface of the gate connector 220, the top surface of the dual dielectric pillar 130, etc.

As shown in FIG. 13B, the dual dielectric pillar 130 may include the first dielectric material in gate regions 295 that are in-line with associated in-line gates 200 within the pMOS side 120 and within the nMOS side 120'. Further, the dual dielectric pillar 130 may at least partially include the second dielectric material in source/drain regions 297 that are outside the footprint of the in-line gates 200 within the pMOS side 120 and within the nMOS side 120'. Further when in-line gates 200 within the pMOS side 120 and within the nMOS side 120' are connected, the dual dielectric spacer may further include the gate connector 220 within the appropriate gate regions 295.

Figure 14:
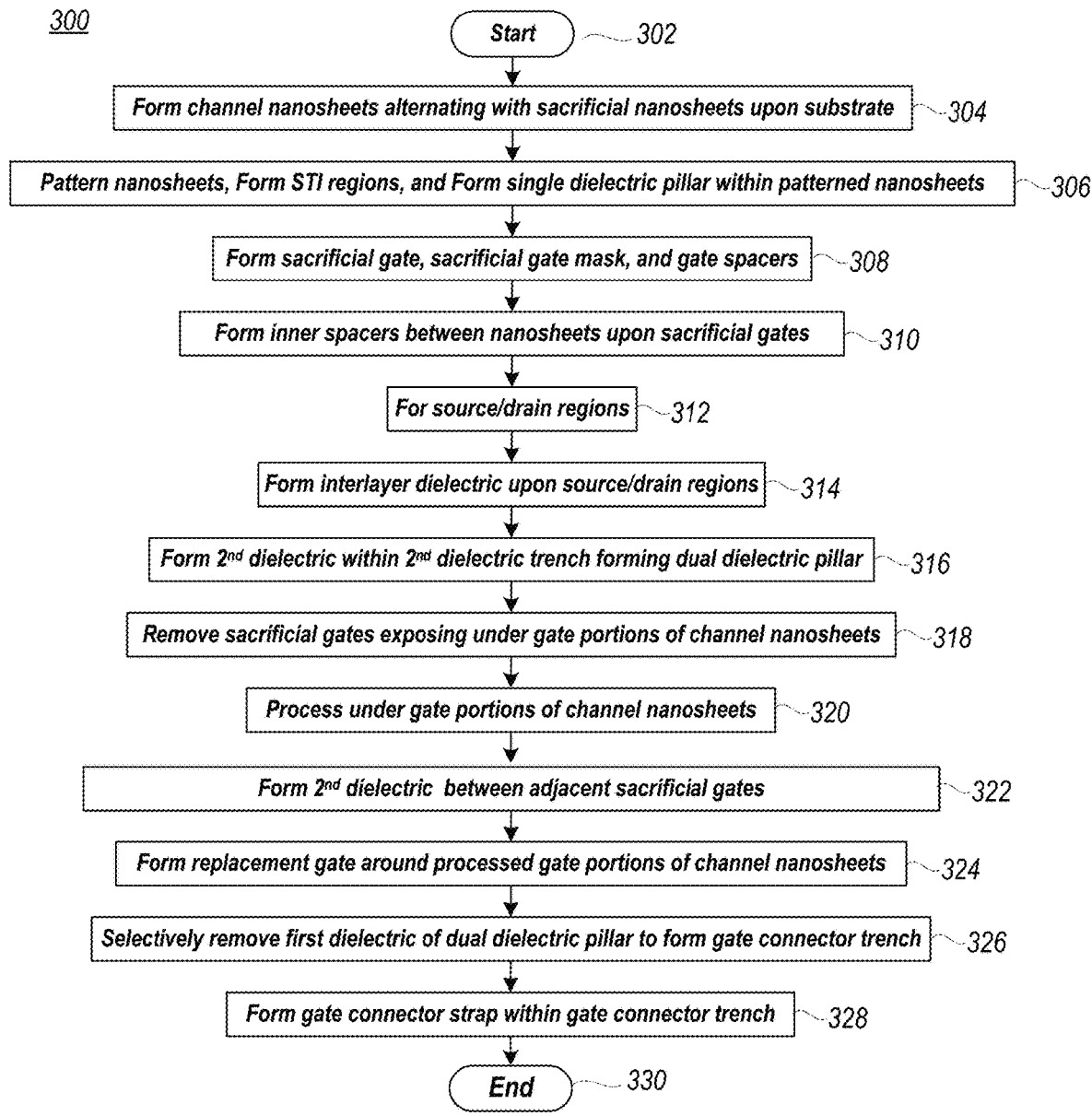
FIG. 14 is a flow diagram illustrating a semiconductor device fabrication method, in accordance with one or more embodiments.

FIG. 14 depicts a flow diagram illustrating a method 300 of fabricating the semiconductor structure 100, according to one or more embodiments of the present invention. Method 300 may begin at block 302 and continue with forming channel nanosheets alternating with sacrificial nanosheets upon a substrate (block 304).

As depicted in FIG. 13, the method 300 begins at block 302 and continues with forming channel nanosheets 112, 114, and 116 alternating with sacrificial nanosheets 102, 104, 106, and 108 upon substrate 110 (block 304).

At block 306, channel nanosheets 112, 114, and 116 and sacrificial nanosheets 102, 104, 106, and 108 may be patterned and may be form nanosheet stacks, STI regions 122 may be formed, and a single dielectric pillar 130 may be formed between the patterned nanosheet stacks.

At block 308, a sacrificial gate 140, gate mask 150, and gate spacers 160 may be formed. At block 310, portions of sacrificial nanosheets 102, 104, 106, and 108 may be removed and inner spacers 170 may be formed between channel nanosheets upon sacrificial gates 140.

At block 312, source/drain regions 180, 182 are formed upon substrate 110. At block 314, an inter-layer dielectric 190 may be formed.

At block 316 a second dielectric 132 is formed within a formed dielectric trench of the single dielectric pillar 130, thereby forming a dual dielectric pillar 130.

At block 318, sacrificial gate 140 is removed thereby exposing under gate portions of the channel nanosheets 112, 114, and 116 and sacrificial nanosheets 102, 104, 106, and 108 there below. At block 320, these portions of sacrificial nanosheets 102, 104, 106, and 108 may be removed and these retained portions of channel nanosheets 112, 114, and 116 may be processed (a high-k dielectric is formed around the channel nanosheets, a work function layer is formed around the high-k dielectric, etc.).

At block 322 an inter-layer dielectric 192 may be formed upon the inter-layer dielectric 190 between adjacent gates spacers 160 and a block 324 a replacement gate 200 may be formed around the processed At block 424 a replacement gate 200, such as a metal gate, may be formed between gate spacers 160 and around the processed channel nanosheets 112, 114, and 116.

In those embodiments, where inline gates 200 within pMOS side 120 are to be connected with nMOS side 120', the first dielectric of the dual dielectric pillar 130 may be removed selective to the second dielectric material of the dual dielectric pillar 130 to form a gate connector trench 212.

At block 328, a conductive gate connector 220 may be formed within the gate connector trench 212 to physically and electrically connect inline gates 200 within pMOS side 120 are to be connected with nMOS side 120'. Method 300 may bend at block 330.

The method flow diagram depicted herein is exemplary. There can be many variations to the diagram or operations described therein without departing from the spirit of the embodiments. For instance, the operations can be performed in a differing order, or operations can be added, deleted or modified. All of these variations are considered a part of the claimed embodiments.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments described herein.

What is claimed is:

1. A forksheet nanosheet semiconductor device fabrication method comprising:
   forming a plurality of channel nanosheet layers upon a substrate;
   forming a dielectric pillar comprising a first dielectric within the, plurality of channel nanosheet layers thereby forming a first nanosheet stack directly against a first sidewall of the dielectric pillar and a second nanosheet stack directly against a second sidewall of the dielectric pillar;
   forming a pair of sacrificial gate structures around the first nanosheet stack and around the second nanosheet stack;
   forming a trench within the dielectric pillar self-aligned to and between the pair of sacrificial gate structures; and
   forming a second dielectric different than the first dielectric within the trench to form a dual dielectric pillar.

2. The fabrication method of claim 1, further comprising:
   partially removing at least a portion of the second dielectric selective to the first dielectric to form a pair of connector trenches with each gate connector trench of the pair of connector trenches exposing a portion of a pair of replacement gate structures that are formed in place of and after a removal of the pair of sacrificial gate structures.

3. The fabrication method of claim 2, further comprising:
   forming a conductive material within the pair of gate connector trenches.

4. The fabrication method of claim 2, wherein a bottom surface of the trench is above a top surface of the substrate.

5. The fabrication method of claim 2, wherein a bottom surface of the trench is coplanar with a top surface of the substrate.

6. The fabrication method of claim 2, wherein a first source/drain region is directly connected to the second dielectric on the first sidewall of the dielectric pillar and a second source/drain region is directly connected to the second dielectric on the second sidewall of the dielectric pillar.

7. The fabrication method of claim 2, wherein the first dielectric is in direct contact with each of the pair of replacement gate structures.

8. A forksheet semiconductor device comprising:
   a first side separated from a second side by a dual dielectric pillar that comprises a first sidewall that faces the first side, a second sidewall that faces the second side, a first dielectric, and a second dielectric that is different from the first dielectric;
   a first source/drain region within the first side that is directly connected to the second dielectric of the first sidewall of the dual dielectric pillar;
   a second source/drain region within the second side that is directly connected to the second dielectric of the second sidewall of the dual dielectric pillar; and
   an in-line gate structure comprising a first gate within the first side and a second gate within the second side, wherein the first gate is directly connected to the first dielectric of the first sidewall of the dual dielectric pillar and the second gate is directly connected to the first dielectric of the second sidewall of the dual dielectric pillar.

9. The forksheet semiconductor device of claim 8, wherein the in-line gate structure further comprises a conductive gate connector directly upon the first dielectric that is directly connected to the first gate and is directly connected to the second gate.

10. The forksheet semiconductor device of claim 8, wherein the first source/drain region is further directly connected to the first dielectric of the first sidewall of the dual dielectric pillar and wherein the second source/drain region is further directly connected to the first dielectric of the second sidewall of the dual dielectric pillar.

11. The forksheet semiconductor device of claim 8, further comprising:
   a first plurality of channel nanosheets within the first side that are directly connected to the first dielectric of the first sidewall of the dual dielectric pillar; and
   a second plurality of channel nanosheets within the second side that are directly connected to the first dielectric of the second sidewall of the dual dielectric pillar.

12. The forksheet semiconductor device of claim 9, wherein a bottom surface of the conductive gate connector is above a bottom surface of the second dielectric.

13. The forksheet semiconductor device of claim 8, wherein the first dielectric has etch selectivity relative to the second dielectric.

14. A forksheet nanosheet semiconductor device comprising:
   a dual dielectric pillar comprising a sidewall, a first dielectric, and a second dielectric different than the first dielectric;
   a plurality of first channel nanosheets that directly contact the first dielectric of the sidewall of the dual dielectric pillar;
   a first source/drain region that directly contacts the plurality of channel nanosheets and that directly contacts the second dielectric of the sidewall of the dual dielectric pillar; and a gate that directly contacts the plurality of channel nanosheets and that directly contacts the first dielectric of the sidewall of the dual dielectric pillar.

15. The forksheet nanosheet semiconductor device of claim 14, further comprising:
a second source/drain region that directly contacts the plurality of channel nanosheets and that directly contacts the second dielectric on the sidewall of the dual dielectric pillar.

16. The forksheet nanosheet semiconductor device of claim 15, wherein the first source/drain region directly contacts a first region of the second dielectric and wherein the second source/drain region directly contacts a second region of the second dielectric.

17. The forksheet nanosheet semiconductor device of claim 16, wherein the dual dielectric pillar further comprises a gate connector that directly contacts the first region of the second dielectric, that directly contacts the second region of the second dielectric, and that directly contacts the first dielectric.

18. The forksheet nanosheet semiconductor device of claim 17, wherein the gate connector further directly contacts the gate.

19. The forksheet nanosheet semiconductor device of claim 14, wherein the dual dielectric pillar further comprises a top surface that is coplanar with a top surface of the gate.

20. The forksheet nanosheet semiconductor device of claim 14 wherein the dual dielectric pillar further comprises a bottom surface that is below a bottom surface of the first source/drain region.

* * * * *